US012658888B2

(12) United States Patent
Nishimura

(10) Patent No.: US 12,658,888 B2
(45) Date of Patent: Jun. 16, 2026

(54) CRYSTAL RESONATOR

(71) Applicant: Murata Manufacturing Co., Ltd.,
Nagaokakyo (JP)

(72) Inventor: Toshio Nishimura, Nagaokakyo (JP)

(73) Assignee: **MURATA MANUFACTURING CO.,
LTD.,** Nagaokakyo (JP)

( * ) Notice: Subject to any disclaimer, the term of this
patent is extended or adjusted under 35
U.S.C. 154(b) by 148 days.

(21) Appl. No.: 18/668,512

(22) Filed: May 20, 2024

(65) Prior Publication Data

US 2024/0356528 A1     Oct. 24, 2024

Related U.S. Application Data

(63) Continuation of application No.
PCT/JP2022/030743, filed on Aug. 12, 2022.

(30) Foreign Application Priority Data

Jan. 19, 2022     (JP) ................................. 2022-006230

(51) Int. Cl.
*H03H 9/25* (2006.01)
*H03H 9/02* (2006.01)
*H03H 9/145* (2006.01)
(52) U.S. Cl.
CPC .......... *H03H 9/25* (2013.01); *H03H 9/02551*
(2013.01); *H03H 9/145* (2013.01)
(58) Field of Classification Search
CPC ...... H10N 30/067; H10N 30/87; H10N 30/50;
H10N 30/20; H03H 9/25; H03H 9/02157;
H03H 9/19; H03H 9/145; H03H 9/02551
See application file for complete search history.

(56) References Cited

U.S. PATENT DOCUMENTS 7,463,119 B2    12/2008  Morita et al.
8,344,815 B2     1/2013  Yamanaka
(Continued)

FOREIGN PATENT DOCUMENTS

JP        S53-038284 A       4/1978
JP        H04-360309 A      12/1992
(Continued)

OTHER PUBLICATIONS

International Search Report received for PCT Patent Application
No. PCT/JP2022/030743, mailed on Nov. 15, 2022, 3 pages (English Translation only).

*Primary Examiner* — Quan Tra
(74) *Attorney, Agent, or Firm* — ArentFox Schiff LLP

(57)        ABSTRACT

A crystal resonator is provided that includes a crystal
substrate having first and second main surfaces; a first and
second comb electrodes on the first main surface and that
each include electrode fingers that are alternately arranged.
The first comb electrode includes a first electrode finger and
the second comb electrode includes a second electrode
finger adjacent to the first electrode finger. Thickness shear
vibration is excited at a portion overlapping with a gap
between the first and second electrode fingers, depending on
a potential difference between the first and second electrode
fingers. A duty ratio (L1+L2 (/(2×P1) on a first main surface
side is from 0.15 to 0.33 inclusive or from 0.62 to 0.82
inclusive where a width of the first electrode finger is
denoted as L1, a width of the second electrode finger is and
a distance between the first and second electrode fingers is
P1.

20 Claims, 26 Drawing Sheets

2

(56) References Cited

U.S. PATENT DOCUMENTS

| | | | |
|---|---|---|---|
| 10,491,192 B1 | 11/2019 | Plesski et al. | |
| 10,630,256 B2 | 4/2020 | Ylilammi et al. | |
| 10,917,070 B2 | 2/2021 | Plesski et al. | |
| 11,057,013 B2 | 7/2021 | Ylilammi et al. | |
| 11,870,408 B2 | 1/2024 | Ylilammi et al. | |
| 2006/0145569 A1 | 7/2006 | Morita et al. | |
| 2011/0199163 A1 | 8/2011 | Yamanaka | |
| 2013/0096825 A1 | 4/2013 | Mohanty | |
| 2014/0145556 A1* | 5/2014 | Kadota | H03H 9/02228 |
| | | | 310/313 A |
| 2016/0352304 A1* | 12/2016 | Kadota | H03H 9/02559 |
| 2018/0159497 A1* | 6/2018 | Iwamoto | H03H 9/02574 |
| 2018/0323769 A1* | 11/2018 | Yamamoto | H03H 9/6483 |
| 2019/0386635 A1 | 12/2019 | Plesski et al. | |
| 2020/0083860 A1 | 3/2020 | Ylilammi et al. | |
| 2020/0091893 A1 | 3/2020 | Plesski et al. | |
| 2020/0186123 A1* | 6/2020 | Miura | H03H 9/02897 |
| 2020/0244245 A1 | 7/2020 | Ylilammi et al. | |
| 2020/0304102 A1* | 9/2020 | Kanazawa | H03H 9/725 |
| 2020/0395915 A1* | 12/2020 | Giner De Haro | H03H 9/02275 |
| 2021/0408996 A1 | 12/2021 | Ylilammi et al. | |
| 2023/0076316 A1 | 3/2023 | Mimura et al. | |

FOREIGN PATENT DOCUMENTS

| | | | | |
|---|---|---|---|---|
| JP | 2005217818 A | * | 8/2005 | |
| JP | 2006-191330 A | | 7/2006 | |
| JP | 2013-051485 A | | 3/2013 | |
| JP | 2021-527344 A | | 10/2021 | |
| JP | 2021-536721 A | | 12/2021 | |
| WO | 2010/047114 A1 | | 4/2010 | |
| WO | 2021/241435 A1 | | 12/2021 | |

* cited by examiner

CRYSTAL RESONATOR

CROSS REFERENCE TO RELATED APPLICATIONS

This application is a continuation of International Application No. PCT/JP2022/030743, filed Aug. 12, 2022, which claims priority to Japanese Patent Application No. 2022-006230, filed Jan. 19, 2022, the entire contents of each of which are hereby incorporated by reference in their entirety.

TECHNICAL FIELD

The present invention relates to a crystal resonator.

BACKGROUND

Resonance devices including resonators for applications such as timing devices, sensors, and oscillators are used in various electronic devices such as mobile communication terminals, communication base stations, and home appliances.

For example, Japanese Unexamined Patent Application Publication No. 2013-51485 (hereinafter "Patent Document 1") discloses an acoustic wave device that includes a piezoelectric substrate, a first comb electrode having a plurality of electrode fingers, and a second comb electrode having a plurality of electrode fingers. In the acoustic wave device described in Patent Document 1, the first and second comb electrodes are provided on one surface side of the piezoelectric substrate, and each electrode finger of the first and second comb electrodes is arranged at a position, at which distribution of absolute values of induced charges induced on the electrode of the piezoelectric substrate becomes maximal and polarities of the induced charges are mutually different.

However, the electrode fingers are provided on positions at which displacement of the piezoelectric substrate becomes maximal or minimal, in the acoustic wave device described in Patent Document 1. Therefore, physical properties and dimensions of the electrode fingers largely affect various characteristics such as a quality factor (Q) and an electromechanical coupling coefficient (k).

SUMMARY OF THE INVENTION

Accordingly, it is object of the present invention to provide a crystal resonator with improved characteristics.

In an exemplary aspect, a crystal resonator is provided that includes a crystal substrate that has a first main surface and a second main surface that is opposed to the first main surface; a first comb electrode on the first main surface of the crystal substrate; and a second comb electrode on the first main surface of the crystal substrate. Each of the first comb electrode and the second comb electrode includes a plurality of electrode fingers that are alternately arranged in a manner to be separated from each other. The plurality of electrode fingers of the first comb electrode include a first electrode finger. The plurality of electrode fingers of the second comb electrode include a second electrode finger that is adjacent to the first electrode finger. Thickness shear vibration is excited at a portion overlapping with a gap between the first electrode finger and the second electrode finger, depending on a potential difference between the first electrode finger and the second electrode finger. L1 is a width of the first electrode finger, L2 is a width of the second electrode finger, and P2 is a distance between the first electrode finger and the second electrode finger in a direction in which the first electrode finger and the second electrode finger are arranged. Moreover, a duty ratio $(L1+L2)/(2 \times P1)$ on a first main surface side is from 0.15 to 0.33 inclusive or from 0.62 to 0.82 inclusive.

In another aspect, a crystal resonator is provided that includes a crystal substrate that has a first main surface and a second main surface that is opposed to the first main surface; a first comb electrode on the first main surface of the crystal substrate; and a second comb electrode on the first main surface of the crystal substrate. Each of the first comb electrode and the second comb electrode includes a plurality of electrode fingers that are alternately arranged in a manner to be separated from each other. The plurality of electrode fingers of the first comb electrode include a first electrode finger. The plurality of electrode fingers of the second comb electrode include a second electrode finger that is adjacent to the first electrode finger. Thickness shear vibration is excited at a portion overlapping with a gap between the first electrode finger and the second electrode finger, depending on a potential difference between the first electrode finger and the second electrode finger. The first main surface and the second main surface are configured to displace in a direction parallel to the first electrode finger and the second electrode finger along with the thickness shear vibration. Displacement on at least the second main surface of the first main surface and the second main surface becomes maximal or minimal at an intermediate region in the direction, in which the first and second electrode fingers extend, of the portion overlapping with the gap.

According to the exemplary aspects of the present invention, a crystal resonator is provided with improved characteristics.

DETAILED DESCRIPTION OF EMBODIMENTS

Figure 1:
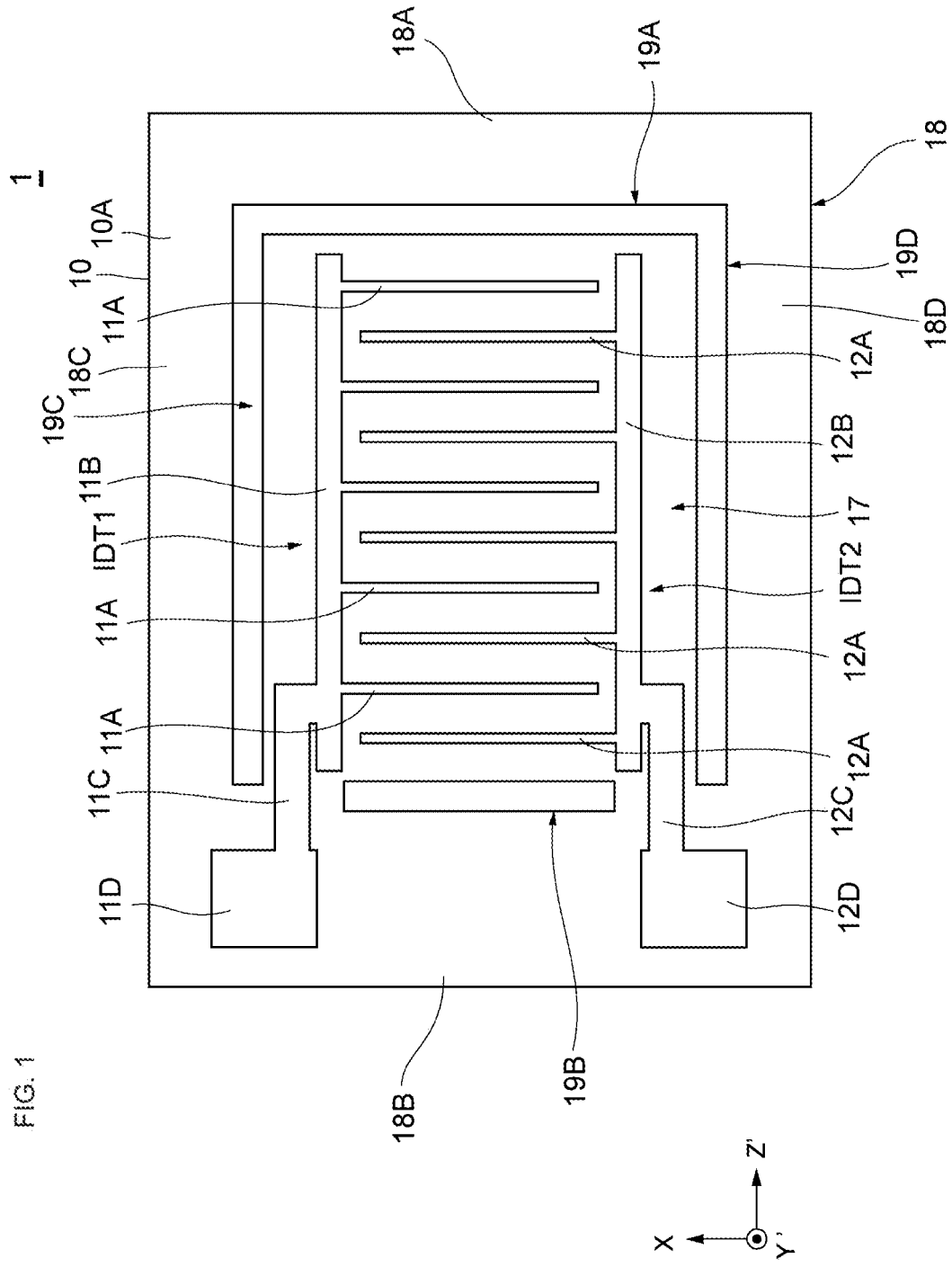
FIG. 1 is a plan view schematically illustrating a configuration of a crystal resonator according to a first exemplary embodiment.

Exemplary embodiments of the present invention will be described below. In the following description of the drawings, the same or similar components are denoted by the same or similar reference characters. The drawings are examples, and the dimensions and shapes of respective components are schematic, and the technical scope of the present invention should not be limitedly interpreted to the embodiments.

First Exemplary Embodiment

Figure 2:
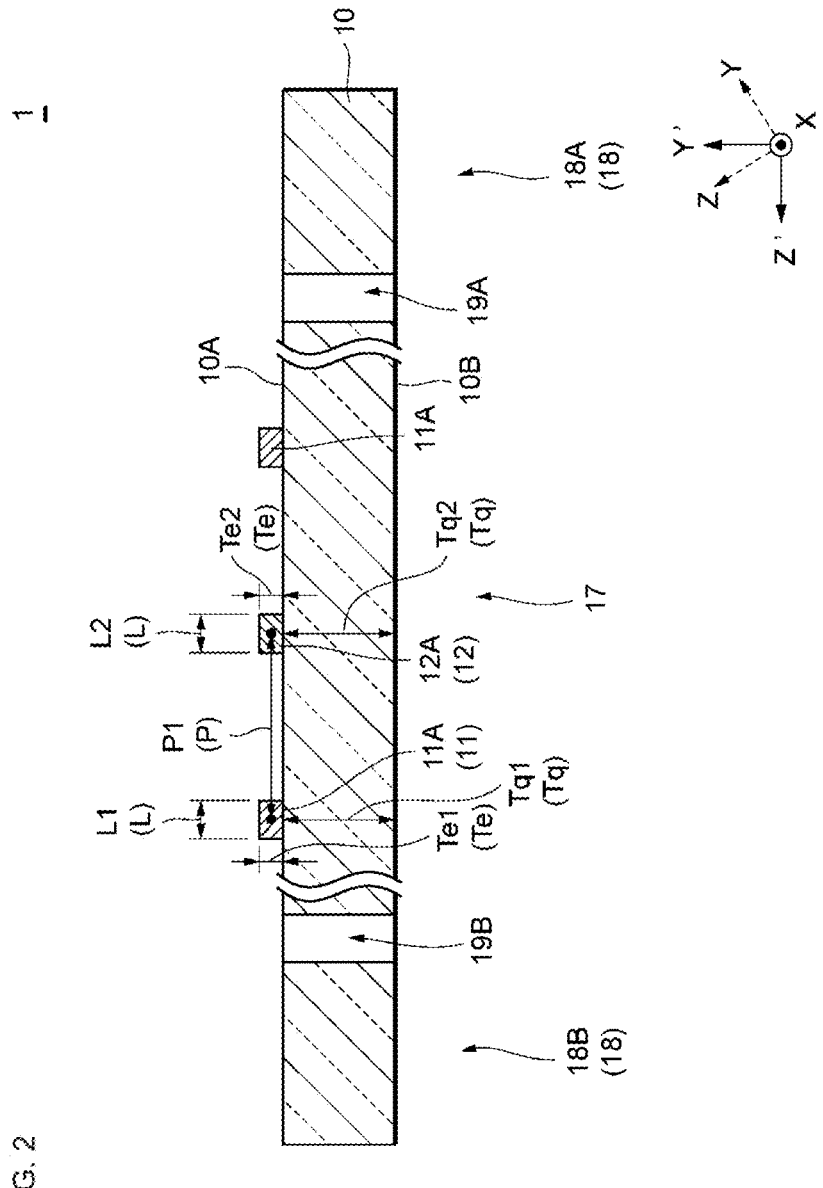
FIG. 2 is a sectional view schematically illustrating the configuration of the crystal resonator according to the first exemplary embodiment.
Figure 3:
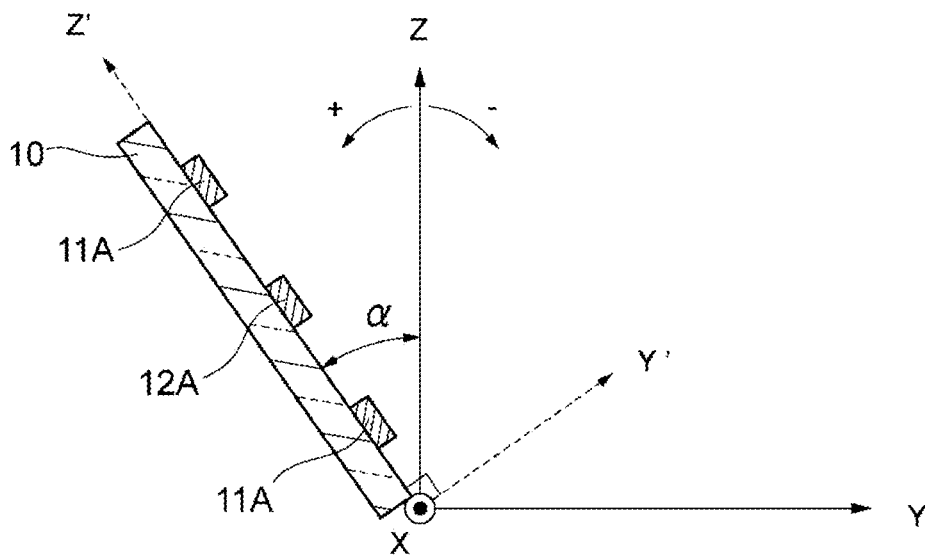
FIG. 3 is a drawing for explaining a crystal axis direction of a crystal substrate according to the first exemplary embodiment.

A configuration of a crystal resonator 1 according to a first exemplary embodiment will be first described with reference to FIGS. 1 to 3. FIG. 1 is a plan view schematically illustrating the configuration of the crystal resonator according to the first embodiment. FIG. 2 is a sectional view schematically illustrating the configuration of the crystal resonator according to the first embodiment. FIG. 3 is a drawing for explaining a crystal axis direction of a crystal substrate according to the first embodiment.

In general, the crystal resonator 1 is an electromechanical energy conversion element configured to convert electrical energy and mechanical energy by using a piezoelectric effect. The crystal resonator 1 includes: a crystal substrate 10; a first comb electrode (inter digital transducer) IDT1 and a second comb electrode IDT2, which form a pair of excitation electrodes; a first extended electrode 11C and a second extended electrode 12C, which form a pair of extended electrodes; and a first connection electrode 11D and a second connection electrode 12D, which form a pair of connection electrodes.

The crystal substrate 10 is made of quartz crystal whose cut-angle is specified by crystal axes which are an X axis (electrical axis), a Y axis (mechanical axis), and a Z axis (optical axis). As illustrated in FIG. 3, the crystal substrate 10 is quartz crystal with a cut-angle of a plane orthogonal to the Y axis rotated about the X axis by a rotation angle α, that is, a rotated Y-cut crystal plate. For purposes of this disclosure and according to the exemplary aspect, regarding the rotation angle α, when viewed from the positive direction side of the X axis (from the front to the back of the paper in FIG. 3), counterclockwise rotation is defined as positive (+), and clockwise rotation is defined as negative (−). For example, the crystal substrate 10 is AT-cut, and α=+35°±10° holds. As another example, the crystal substrate 10 is BT-cut, and α=−40°±10° holds.

As illustrated in FIG. 2, the crystal substrate 10 has a first main surface 10A and a second main surface 10B that oppose each other, and which are specified by the X axis and a Z' axis obtained by rotating the Z axis about the X axis by the rotation angle α. The first main surface 10A is positioned on a positive direction side of a Y' axis, which is obtained by rotating the Y axis about the X axis by the rotation angle α, with respect to the second main surface 10B. The first main surface 10A and the second main surface 10B correspond to a pair of main surfaces, which are opposed to each other, of the crystal substrate 10. Further, the crystal substrate 10 has the thickness in the Y' axis direction. The crystal substrate 10 has, for example, a flat plate shape, and thickness Tq1 of a portion overlapping with a first electrode finger 11, which will be described later, in the Y' axis direction and thickness Tq2 of a portion overlapping with a second electrode finger 12, which will be described later, in the Y' axis direction are substantially equal to each other (Tq1=Tq2=Tq). As an example, the thickness Tq1 is a dimension of the crystal substrate 10 in the Y' axis direction at a position overlapping with a central axis of the first electrode finger 11, which will be described later, in the Y' axis direction, and the thickness Tq2 is a dimension of the crystal substrate 10 in the Y' axis direction at a position overlapping with a central axis of the second electrode finger 12, which will be described later, in the Y' axis direction. For purposes of this disclosure and according to an exemplary aspect, a size relationship between the thickness Tq1 and the thickness Tq2 is not limited to the above description, and the thickness Tq1 and the thickness Tq2 may be different from each other. For example, the difference between the thickness Tq1 and the thickness Tq2 may be approximately 0.1% of the larger one of the thickness Tq1 and the thickness Tq2.

In a plan view of the first main surface 10A of the crystal substrate 10, the crystal substrate 10 has a central portion 17 and a peripheral portion 18 provided in a periphery of the central portion 17. The central portion 17 is formed in a rectangular shape. The peripheral portion 18 is formed in a frame shape surrounding the central portion 17. The peripheral portion 18 has: a frame body 18A, which is provided on the positive direction side of the Z' axis; a frame body 18B, which is provided on the negative direction side of the Z' axis; a frame body 18C, which is provided on the positive direction side of the X axis; and a frame body 18D, which is provided on the negative direction side of the X axis; with respect to the central portion 17. The frame body 18A connects an end portion of the frame body 18C on the positive direction side of the Z' axis with an end portion of the frame body 18D on the positive direction side of the Z' axis. The frame body 18B connects an end portion of the frame body 18C on the negative direction side of the Z' axis with an end portion of the frame body 18D on the negative direction side of the Z' axis.

As further shown, a through hole 19A is formed between the central portion 17 and the frame body 18A, a through hole 19B is formed between the central portion 17 and the frame body 18B, a through hole 19C is formed between the central portion 17 and the frame body 18C, and a through hole 19D is formed between the central portion 17 and the frame body 18D. The through holes 19A to 19D are through holes that penetrate through the crystal substrate 10 in the Y' axis direction. The through holes 19A and 19B are formed in a slit shape extending in the X axis direction, and the through hole 19C and the through hole 19D are formed in a slit shape extending in the Z' axis direction. The through hole 19A connects end portions of the through hole 19C and the through hole 19D on the positive direction side of the Z' axis, and the through hole 19A, the through hole 19C, and the through hole 19D thus form a U shape. The through hole 19B is separated from the through hole 19C and the through hole 19D.

The first comb electrode IDT1 and the second comb electrode IDT2 are provided on the central portion 17. The first comb electrode IDT1 includes a plurality of electrode fingers 11A and a busbar 11B. The plurality of electrode fingers 11A each extend in the X axis direction and are arranged in the Z' axis direction at equal intervals. The plurality of electrode fingers 11A have substantially equal shapes and dimensions to each other. The busbar 11B is connected with respective end portions of the plurality of electrode fingers 11A on the positive direction side of the X axis and electrically connects the plurality of electrode fingers 11A with each other. The second comb electrode IDT2 includes a plurality of electrode fingers 12A and a busbar 12B. The plurality of electrode fingers 12A each extend in the X axis direction and are arranged in the Z' axis direction at equal intervals. The plurality of electrode fingers 12A have substantially equal shapes and dimensions to each other. The busbar 12B is connected with respective end portions of the plurality of electrode fingers 12A on the negative direction side of the X axis and electrically connects the plurality of electrode fingers 12A with each other.

According to the exemplary aspect, the plurality of electrode fingers 11A and the plurality of electrode fingers 12A are alternately arranged (e.g., interleaved) in a manner to be separated from each other in the Z' axis direction. In this regard, the plurality of electrode fingers 11A include the first electrode finger 11 and the plurality of electrode fingers 12A include the second electrode finger 12 that is adjacent to the first electrode finger 11. The second electrode finger 12 is positioned on the negative direction side of the Z' axis with respect to the first electrode finger 11. The shape and dimension of the first electrode finger 11 is, for example, substantially equal to the shape and dimension of the second electrode finger 12. However, the first electrode finger 11 and the second electrode finger 12 may have mutually different shapes and dimensions.

As illustrated in FIG. 2, a distance between the first electrode finger 11 and the second electrode finger 12 is defined as pitch P1. The pitch P1 is a distance in the Z' axis direction between the central axes of the first electrode finger 11 and the second electrode finger 12 that pass through respective centers of the first electrode finger 11 and the second electrode finger 12 in the Y'Z' section and extend in the X axis direction (hereinafter, referred to merely as "central axes" for purposes of this disclosure).

The dimension of the first electrode finger 11 in the Z' axis direction is defined as width L1, and the dimension of the second electrode finger 12 in the Z' axis direction is defined as width L2. The width L1 is, for example, a dimension in the Z' axis direction passing through the central axis of the first electrode finger 11, but may be a dimension on another position. For example, the width L1 may be a dimension in the Z' axis direction of a bottom surface of the first electrode finger 11 facing the crystal substrate 10, or a dimension in the Z' axis direction of a top surface on the opposite side to the bottom surface. When the first electrode finger 11 is provided to have uneven width in the X axis direction, the width L1 of the first electrode finger 11 may be, for example, an average value of dimensions in the Z' axis direction or the maximum value of the dimensions in the Z' axis direction. The same goes for the width L2. In the example illustrated in FIG. 2, the width L1 and the width L2 are substantially equal to each other ($L1=L2=L$). When the pitch $P1=P$ is assumed, a duty ratio Duty1 of the electrode finger on the first main surface 10A side is expressed as $Duty1=(L1+L2)/(2\times P1)=L/P$. It should be appreciated that a size relationship between the width L1 and the width L2 is not limited to the above description, and the width L1 and the width L2 may be different from each other. For example, the difference between the width L1 and the width L2 may be approximately 20% of the larger one of the width L1 and the width L2.

The dimension of the first electrode finger 11 in the Y' axis direction is defined as thickness Te1, and the dimension of the second electrode finger 12 in the Y' axis direction is defined as thickness Te2. The thickness Te1 is, for example, a dimension in the Y' axis direction passing through the central axis of the first electrode finger 11. When the first electrode finger 11 is provided to have uneven thickness in the X axis direction, the thickness Te1 of the first electrode finger 11 may be, for example, an average value of dimensions in the Y' axis direction or the maximum value of the dimensions in the Y' axis direction. The same goes for the thickness Te2. In the example illustrated in FIG. 2, the thickness Te1 and the thickness Te2 are substantially equal to each other ($Te1=Te2=Te$). It is noted that a size relationship between the thickness Te1 and the thickness Te2 is not limited to the above description, and the thickness Te1 and the thickness Te2 may be different from each other. For example, the difference between the thickness Te1 and the thickness Te2 may be approximately 10% of the larger one of the thickness Te1 and the thickness Te2.

The first extended electrode 11C and the second extended electrode 12C are provided from the central portion 17 to the peripheral portion 18. The first extended electrode 11C and the second extended electrode 12C are provided or otherwise disposed on the first main surface 10A of the crystal substrate 10. The first extended electrode 11C passes between the through hole 19B and the through hole 19C, and the second extended electrode 12C passes between the through hole 19B and the through hole 19D. The first extended electrode 11C is connected with the first comb electrode IDT1 in the central portion and is connected with the first connection electrode 11D in the peripheral portion 18. The second extended electrode 12C is connected with the second comb electrode IDT2 in the central portion and is connected with the second connection electrode 12D in the peripheral portion 18.

The first connection electrode 11D and the second connection electrode 12D are provided on the frame body 18B of the peripheral portion 18. The first connection electrode 11D and the second connection electrode 12D are provided on the first main surface 10A of the crystal substrate 10. The first connection electrode 11D is positioned on the positive direction side of the X axis with respect to the second connection electrode 12D. The first connection electrode 11D is electrically connected with the first comb electrode IDT1 via the first extended electrode 11C. The second connection electrode 12D is electrically connected with the second comb electrode IDT2 via the second extended electrode 12C.

The plurality of electrode fingers 11A and the busbar 11B of the first comb electrode IDT1 and the first extended electrode 11C and the first connection electrode 11D are continued to be integrally formed. The same goes for the plurality of electrode fingers 12A and the busbar 12B of the second comb electrode IDT2 and the second extended electrode 12C and the second connection electrode 12D. In the exemplary aspect, these electrodes of the crystal resonator 1 are made of, for example, aluminum (Al) or an alloy mainly composed of aluminum. According to the exemplary aspect, the electrodes of the crystal resonator 1 preferably contain 90% or more of aluminum. However, the material of the electrodes of the crystal resonator 1 is not limited to the above. The electrodes of the crystal resonator 1 may be made of titanium (Ti), nickel (Ni), molybdenum (Mo), copper (Cu), platinum (Pt), gold (Au), silver (Ag), chromium (Cr), tungsten (W), or alloys mainly composed of one of these metals according to alternative aspects. The electrode of the crystal resonator 1 is, for example, a monolayer film, but may be a multilayer film in another exemplary aspect.

Figure 4:
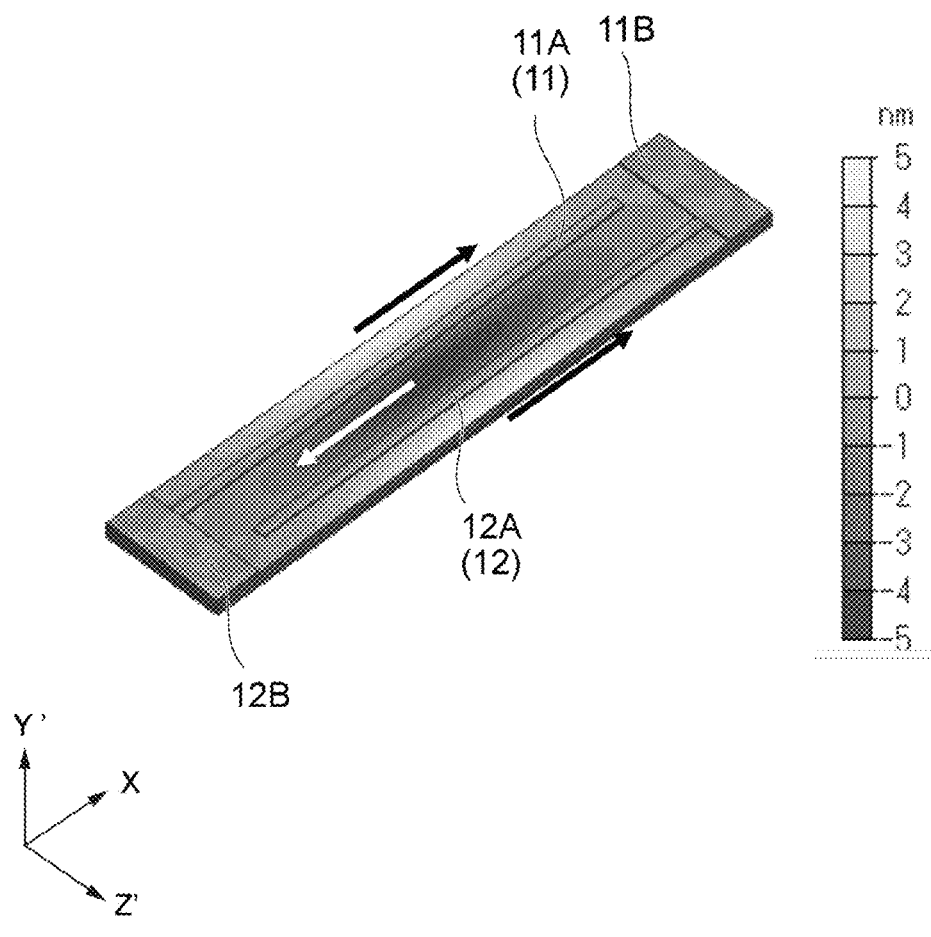
FIG. 4 is a perspective view illustrating a vibration mode according to the first exemplary embodiment.
Figure 5:
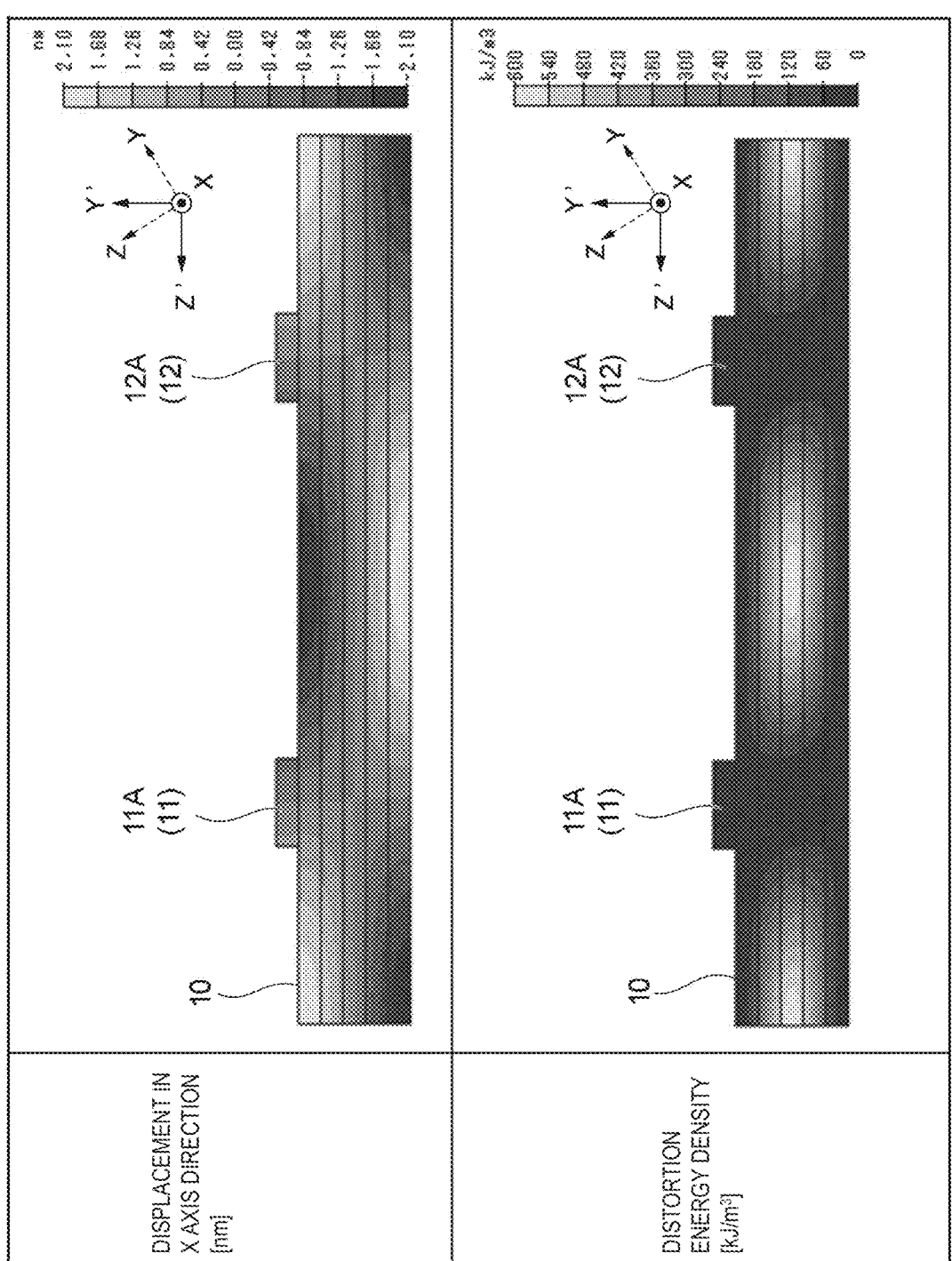
FIG. 5 is a sectional view illustrating displacement and distortion energy density according to the first exemplary embodiment.

A vibration mode in the crystal resonator 1 according to the first embodiment will now be described with reference to FIGS. 4 and 5. FIG. 4 is a perspective view illustrating the vibration mode according to the first embodiment. FIG. 5 is a sectional view illustrating displacement and distortion energy density according to the first embodiment. FIG. 4 illustrates displacement in the X axis direction on the first main surface 10A. The sectional view on the upper stage of FIG. 5 illustrates the magnitude of displacement in the X axis direction on the Y'Z' plane. The sectional view on the lower stage of FIG. 5 illustrates the magnitude of distortion energy density on the Y'Z' plane.

In operation, the main vibration of the crystal resonator 1 is a thickness shear vibration mode. Thickness shear vibration is excited at a portion, which overlaps with a gap between the first electrode finger 11 and the second electrode finger 12 in the Y' axis direction, depending on a potential difference between the first electrode finger 11 and the second electrode finger 12. In response to the thickness shear vibration, the first main surface 10A and the second main surface 10B of the crystal substrate 10 displace in mutually-opposite directions in the X axis direction in which the first electrode finger 11 and the second electrode finger 12 extend.

According to the exemplary aspect, the displacement on at least the second main surface 10B of the first main surface 10A and the second main surface 10B becomes maximal or minimal at an intermediate region in the Z' axis direction, in which the first electrode finger 11 and the second electrode finger 12 are arranged, of the portion overlapping with the gap between the first electrode finger 11 and the second electrode finger 12 in the Y' axis direction. For example, as illustrated in FIG. 5, when the displacement on the first main surface 10A side becomes minimal at the intermediate region of the portion overlapping with the gap between the first electrode finger 11 and the second electrode finger 12 in the Y' axis direction, the displacement on the second main surface 10B side becomes maximal at the intermediate region. For purposes of this disclosure, the expression that displacement of a substrate becomes maximal means that an absolute value of displacement in a certain direction along the X axis becomes locally maximum, and the expression that displacement of a substrate becomes minimal means that an absolute value of displacement in an opposite direction along the X axis becomes locally maximum. For example, a state in which amplitude to the positive direction side of the X axis becomes locally maximum is referred to as maximal, and a state in which amplitude to the negative direction side of the X axis becomes locally maximum is referred to as minimal.

The distortion energy density is maximum at an intermediate region in the Y' axis direction of the intermediate region of the portion overlapping with the gap between the first electrode finger 11 and the second electrode finger 12 in the Y' axis direction. The distortion energy density is approximately 0 at portions overlapping with the first electrode finger 11 and the second electrode finger 12 in the Y' axis direction. Regions having high distortion energy density concentrate on the negative direction side of the Z' axis as going from the first main surface 10A toward the second main surface 10B.

Configurations of crystal resonators according to other exemplary embodiments will be described below. It is noted that the following embodiments will omit the description of matters common to those of the above-described first embodiment and describe only different points. In particular, the same advantageous effects obtained from the same configuration will not be mentioned in sequence.

Second Exemplary Embodiment

Figure 6:
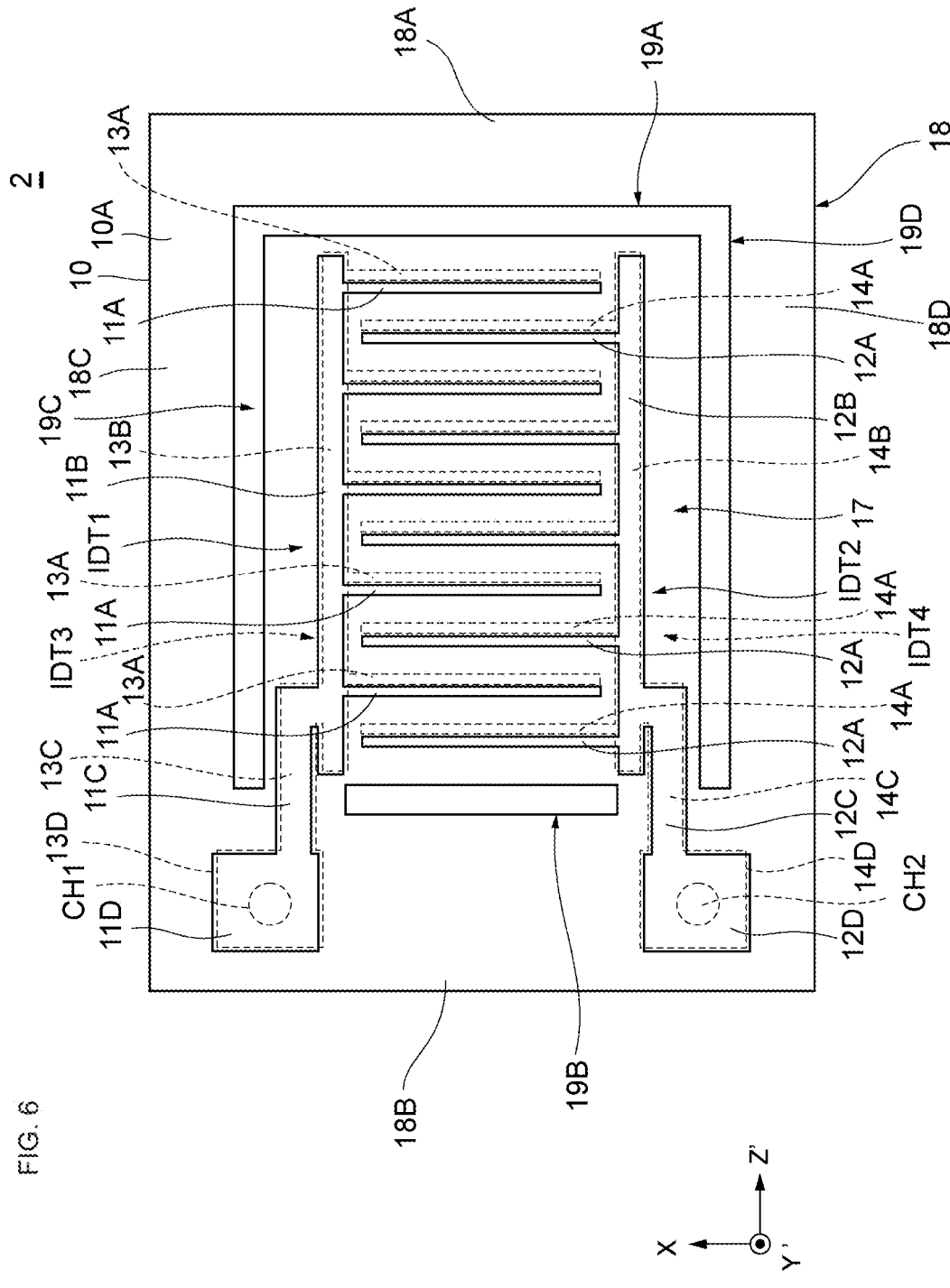
FIG. 6 is a plan view schematically illustrating a configuration of a crystal resonator according to a second exemplary embodiment.
Figure 7:
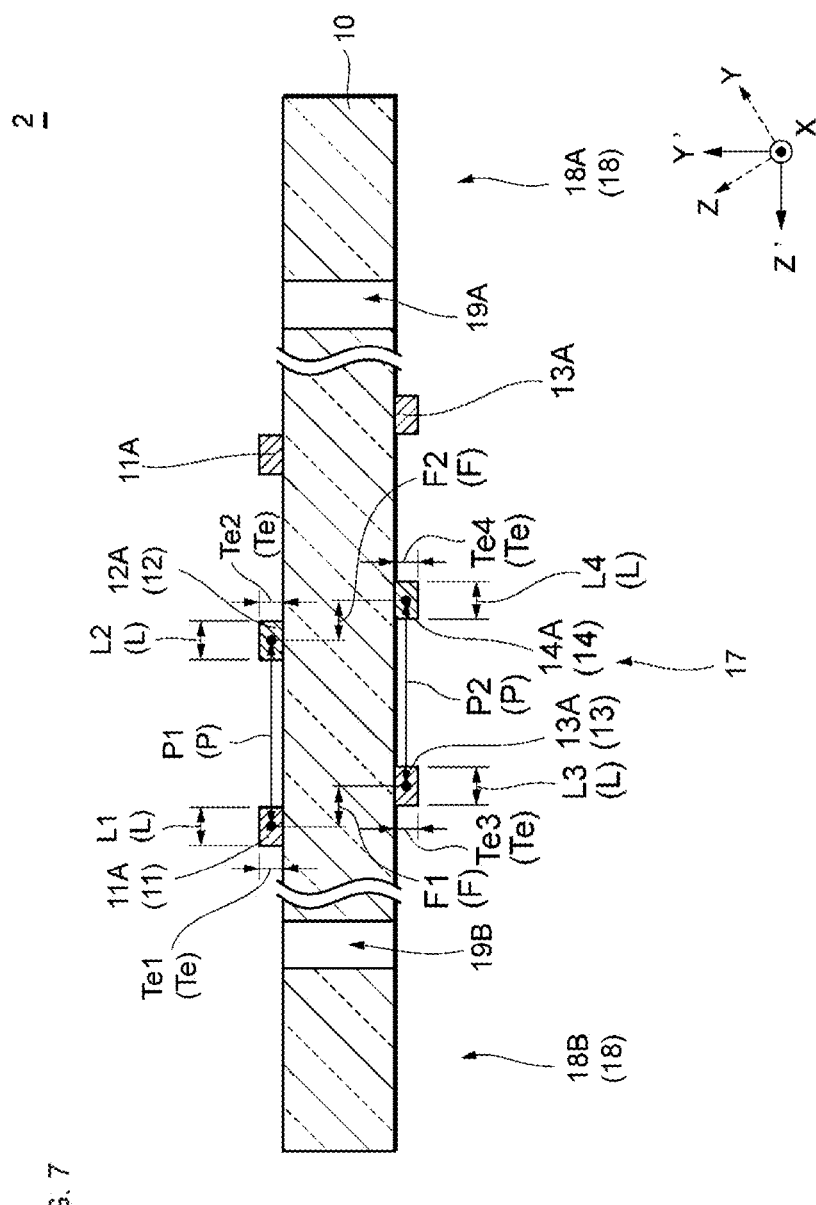
FIG. 7 is a sectional view schematically illustrating the configuration of the crystal resonator according to the second exemplary embodiment.

A configuration of a crystal resonator 2 according to a second exemplary embodiment will now be described with reference to FIGS. 6 and 7. FIG. 6 is a plan view schematically illustrating the configuration of the crystal resonator according to the second embodiment. FIG. 7 is a sectional view schematically illustrating the configuration of the crystal resonator according to the second embodiment.

According to the exemplary aspect, the crystal resonator 2 further includes a third comb electrode IDT3 and a fourth comb electrode IDT4, which form a pair of excitation electrodes; a third extended electrode 13C and a fourth extended electrode 14C, which form a pair of extended electrodes; and a third connection electrode 13D and a fourth connection electrode 14D, which form a pair of connection electrodes. The third comb electrode IDT3 and the fourth comb electrode IDT4, the third extended electrode 13C and the fourth extended electrode 14C, and the third connection electrode 13D and the fourth connection electrode 14D are provided on the second main surface 10B of the crystal substrate 10.

The third comb electrode IDT3 includes a plurality of electrode fingers 13A and a busbar 13B that connects the plurality of electrode fingers 13A with each other. The plurality of electrode fingers 13A are provided along the plurality of electrode fingers 11A of the first comb electrode IDT1. The fourth comb electrode IDT4 includes a plurality of electrode fingers 14A and a busbar 14B that connects the plurality of electrode fingers 14A with each other. The plurality of electrode fingers 14A are provided along the plurality of electrode fingers 12A of the second comb electrode IDT2. In a plan view of the first main surface 10A, the busbar 13B of the third comb electrode IDT3 overlaps with the busbar 11B of the first comb electrode IDT1, the third extended electrode 13C overlaps with the first extended electrode 11C, and the third connection electrode 13D overlaps with the first connection electrode 11D. The third connection electrode 13D is electrically connected with the first connection electrode 11D via a through electrode CH1. Similarly, the busbar 14B of the fourth comb electrode IDT4 overlaps with the busbar 12B of the second comb electrode IDT2, the fourth extended electrode 14C overlaps with the second extended electrode 12C, and the fourth connection electrode 14D overlaps with the second connection electrode 12D. The fourth connection electrode 14D is electrically connected with the second connection electrode 12D via a through electrode CH2.

The plurality of electrode fingers 13A and the plurality of electrode fingers 14A are alternately arranged in a manner to be separated from each other in the Z' axis direction. The plurality of electrode fingers 13A include a third electrode finger 13. The plurality of electrode fingers 14A include a fourth electrode finger 14 which is adjacent to the third electrode finger 13. The fourth electrode finger 14 is positioned on the negative direction side of the Z' axis with respect to the third electrode finger 13. The shape and dimension of the third electrode finger 13 is, for example, substantially equal to the shape and dimension of the fourth electrode finger 14. However, the third electrode finger 13 and the fourth electrode finger 14 may have mutually different shapes and dimensions.

In a plan view of the second main surface 10B, the third electrode finger 13 is provided between two electrode fingers 12A, which are adjacent to the first electrode finger 11 on the first main surface 10A. A potential difference between the third electrode finger 13 and the first electrode finger 11 is smaller than a potential difference between the third electrode finger 13 and the second electrode finger 12. The fourth electrode finger 14 is provided between two electrode fingers 11A, which are adjacent to the second electrode finger 12 on the first main surface 10A. A potential difference between the fourth electrode finger 14 and the second electrode finger 12 is smaller than a potential difference between the fourth electrode finger 14 and the first electrode finger 11. As can be seen from the example illustrated in FIG. 6 in which the plurality of electrode fingers 13A and the plurality of electrode fingers 11A are electrically connected with each other, the above-mentioned "potential difference between the third electrode finger 13 and the first electrode finger 11" includes 0. Similarly, it is noted that the above-mentioned "potential difference between the fourth electrode finger 14 and the second electrode finger 12" includes 0.

As illustrated in FIG. 7, a distance between the third electrode finger 13 and the fourth electrode finger 14 is defined as pitch P2 similarly to the pitch P1. The pitch P2 and the pitch P1 are substantially equal to each other (P2=P1=P). However, a size relationship between the pitch P1 and the pitch P2 is not limited to the above description, and the pitch P1 and the pitch P2 may be different from each other.

As illustrated in FIG. 7, the dimension of the third electrode finger 13 in the Z' axis direction is defined as width L3, and the dimension of the fourth electrode finger 14 in the Z' axis direction is defined as width L4, as is the case with the width L1 and the width L2. In the example illustrated in FIG. 7, the width L3 and the width L1 are substantially equal to each other (L3=L1), and the width L4 is substantially equal to the width L2 (L4=L2). The width L1, the width L2, the width L3, and the width L4 are substantially equal to each other (L1=L2=L3=L4=L). However, a size relationship between the width L1, the width L2, the width L3, and the width L4 is not limited to the above description, and the width L3 and the width L1 may be different from each other and the width L4 and the width L2 may be different from each other.

According to the exemplary aspect, the duty ratio on the first main surface 10A side is expressed as $Duty1=(L1+L2)/(2\times P1)$, and the duty ratio on the second main surface 10B side is expressed as $Duty2=(L3+L4)/(2\times P2)$. When $P1=P2=P$ and $L1=L2=L3=L4=L$ are established, the duty ratios are the same as each other on the first main surface 10A side and the second main surface 10B side, being expressed as $Duty=Duty1=Duty2=L/P$. When the duty ratio Duty1 and the duty ratio Duty2 are different from each other, it is preferable that the duty ratio Duty2 is within a range of ±10% of the duty ratio Duty1 from the perspective of suppressing deterioration in the balance of displacement and distortion.

As illustrated in FIG. 7, the dimension of the third electrode finger 13 in the Y' axis direction is defined as thickness Te3, and the dimension of the fourth electrode finger 14 in the Y' axis direction is defined as thickness Te4, as is the case with the thickness Te1 and the thickness Te2. In the example illustrated in FIG. 7, the thickness Te3 and the thickness Te1 are substantially equal to each other (Te3=Te1), and the thickness Te4 and the thickness Te2 are substantially equal to each other (Te4=Te2). The thickness Te1, the thickness Te2, the thickness Te3, and the thickness Te4 are substantially equal to each other (Te1=Te2=Te3=Te4=Te). However, a size relationship between the thickness Te1, the thickness Te2, the thickness Te3, and the thickness Te4 is not limited to the above description, and the thickness Te3 and the thickness Te1 may be different from each other and the thickness Te4 and the thickness Te2 may be different from each other.

As illustrated in FIG. 7, a positional difference of the third electrode finger 13 with respect to the first electrode finger 11 in the Z' axis direction is defined as offset F1. The offset F1 is a distance in the Z' axis direction between respective central axes of the first electrode finger 11 and the third electrode finger 13. The offset F1 is positive on the negative direction side of the Z' axis. Similarly, a positional difference of the fourth electrode finger 14 with respect to the second electrode finger 12 in the Z' axis direction is defined as offset F2. For example, the offset F1 and the offset F2 are substantially equal to each other (F1=F2=F). However, a size relationship between the offset F1 and the offset F2 is not limited to the above description, and the offset F1 and the offset F2 may be different from each other.

In a plan view of the second main surface 10B in the example illustrated in FIGS. 6 and 7, the distance between the central axis of the third electrode finger 13 and the central axis of the first electrode finger 11 is larger than 0 and is smaller than the distance between the central axis of the third electrode finger 13 and the central axis of the second electrode finger 12, in the Z' axis direction in which the third electrode finger 13 and the fourth electrode finger 14 are arranged. That is, an absolute value of the offset F1 is larger than 0 and smaller than the difference between the pitch P1 and the absolute value of the offset F1. Expressed as an inequality, 0<|F1|<P1−|F1| is obtained, and a relationship |F1|<(P1)/2 is established. It is noted that the positional relationship between the first electrode finger 11 and the third electrode finger 13 is not limited to the above description, and the offset F1 may be 0. Namely, the central axis of the third electrode finger 13 may overlap with the central axis of the first electrode finger 11 in the plan view of the second main surface 10B.

Figure 8:
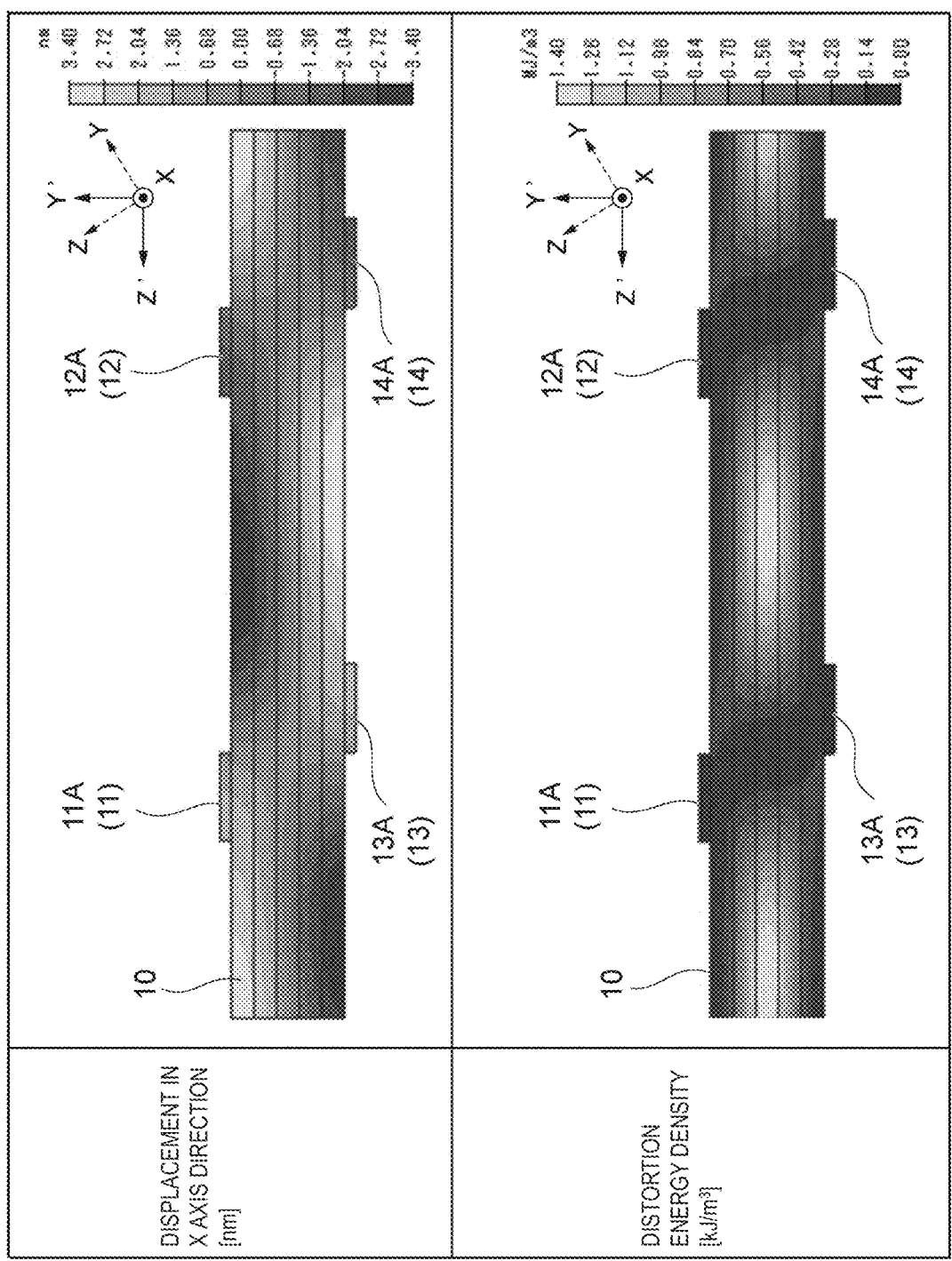
FIG. 8 is a sectional view illustrating displacement and distortion energy density according to the second exemplary embodiment.

A vibration mode in the crystal resonator 2 according to the second embodiment will now be described with reference to FIG. 8. The sectional view on the upper stage of FIG. 8 illustrates the magnitude of displacement in the X axis direction on the Y'Z' plane. The sectional view on the lower stage of FIG. 8 illustrates the magnitude of distortion energy density on the Y'Z' plane.

In operation, a thickness shear vibration is excited at a portion overlapping with a gap between the third electrode finger 13 and the fourth electrode finger 14 in the Y' axis direction, depending on a potential difference between the third electrode finger 13 and the fourth electrode finger 14. The displacement on the first main surface 10A side becomes maximal or minimal at the intermediate region of the portion overlapping with the gap between the first electrode finger 11 and the second electrode finger 12 in the Y' axis direction, and the displacement on the second main surface 10B side becomes minimal or maximal at an intermediate region of the portion overlapping with a gap between the third electrode finger 13 and the fourth electrode finger 14 in the Y' axis direction. For example, as illustrated in FIG. 8, when the displacement on the first main surface 10A side becomes minimal at the intermediate region of the portion overlapping with the gap between the first electrode finger 11 and the second electrode finger 12 in the Y' axis direction, the displacement on the second main surface 10B side becomes maximal at the intermediate region of the portion overlapping with the gap between the third electrode finger 13 and the fourth electrode finger 14 in the Y' axis direction. In a plan view of the second main surface 10B, the position of the maximal or minimal displacement on the second main surface 10B is shifted by the offset F1 from the position of the minimal or maximal displacement on the first main surface 10A.

The distortion energy density is maximum at an intermediate region in the Z' axis direction and the Y' axis direction in a portion connecting the gap between the first electrode finger 11 and the second electrode finger 12 (e.g., the gap on the first main surface 10A side) with the gap between the third electrode finger 13 and the fourth electrode finger 14 (e.g., the gap on the second main surface 10B side). The distortion energy density is approximately 0 at a portion connecting the second electrode finger 12 with the fourth electrode finger 14.

Third Exemplary Embodiment

Figure 9:
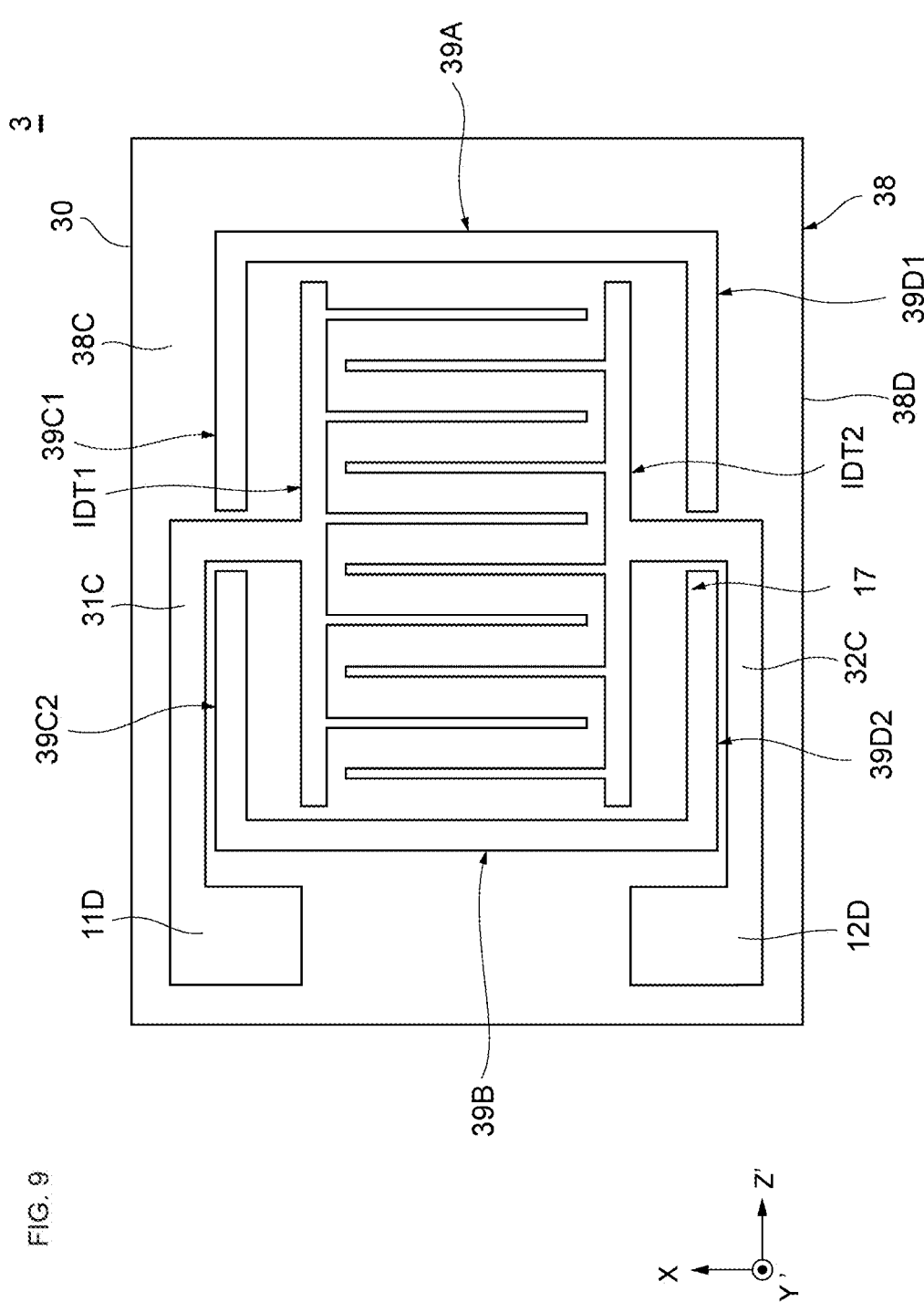
FIG. 9 is a plan view schematically illustrating a configuration of a crystal resonator according to a third exemplary embodiment.

A configuration of a crystal resonator 3 according to a third exemplary embodiment will now be described with reference to FIG. 9. FIG. 9 is a plan view schematically illustrating the configuration of the crystal resonator according to the third embodiment.

As shown, through holes 39A, 39B, 39C1, 39C2, 39D1, and 39D2 are formed in a crystal substrate 30. The through hole 39C1 and the through hole 39C2 are formed in a slit shape extending in the Z' axis direction between the central portion 17 and a frame body 38C and are aligned in the Z' axis direction with an interval therebetween. The through hole 39C1 is positioned on the positive direction side of the Z' axis with respect to the through hole 39C2 and is connected with an end portion of the through hole 39A on the positive direction side of the X axis. The through hole 39C2 is connected with an end portion of the through hole 39B on the positive direction side of the X axis. The through hole 39D1 and the through hole 39D2 are formed in a slit shape extending in the Z' axis direction between the central portion 17 and a frame body 38D and are aligned in the Z' axis direction with an interval therebetween. The through hole 39D1 is positioned on the positive direction side of the Z' axis with respect to the through hole 39D2 and is connected with an end portion of the through hole 39B on the negative direction side of the X axis. The through hole 39D2 is connected with an end portion of the through hole 39B on the negative direction side of the X axis. The through hole 39A, the through hole 39C1, and the through hole 39D1 form a U shape, and the through hole 39B, the through hole 39C2, and the through hole 39D2 form a U shape.

A first extended electrode 31C passes through between the through hole 39C1 and the through hole 39C2 and extends on the frame body 38C so as to electrically connect the first comb electrode IDT1 with the first connection electrode 11D. A second extended electrode 32C passes through between the through hole 39D1 and the through hole 39D2 and extends on the frame body 38D so as to electrically connect the second comb electrode IDT2 with the second connection electrode 12D.

<Comparative Configuration>

Figure 10:
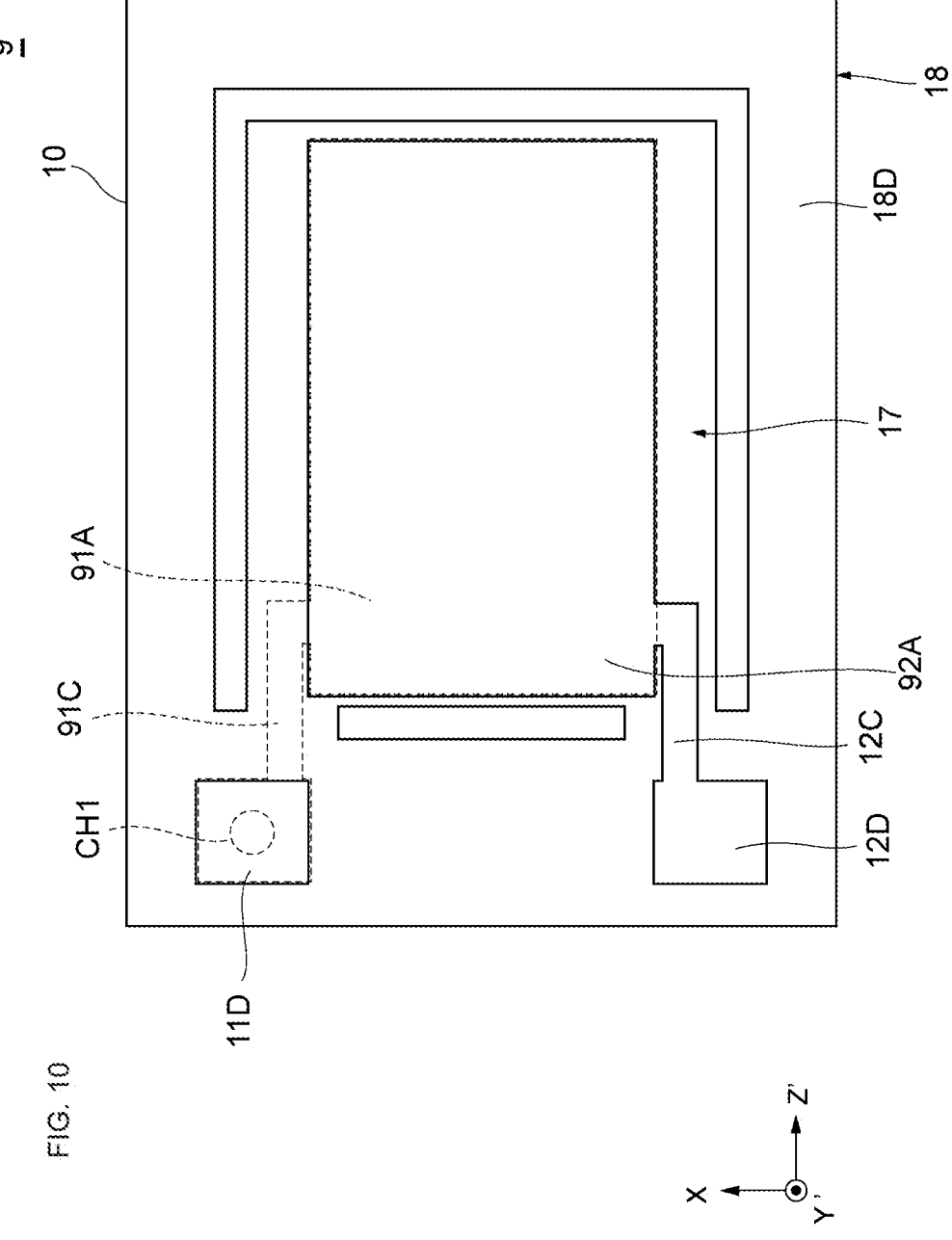
FIG. 10 is a plan view schematically illustrating a configuration of a crystal resonator for comparison.

A configuration of a crystal resonator 9 for comparison will now be described with reference to FIG. 10. FIG. 10 is a plan view schematically illustrating the configuration of the crystal resonator for comparison.

In particular, the crystal resonator 9 includes a first excitation electrode 91A and a second excitation electrode 92A as a pair of excitation electrodes. The first excitation electrode 91A is provided on the first main surface 10A of the crystal substrate 10 and the second excitation electrode 92A is provided on the second main surface 10B. The first excitation electrode 91A and the second excitation electrode 92A are provided on the central portion 17 and are opposed to each other in the Y' axis direction. A first extended electrode 91C is provided on the second main surface 10B and is electrically connected to the first connection electrode 11D via the through electrode CH1.

<Evaluation>

Characteristic improvement according to an exemplary embodiment will now be described with reference to FIGS. 11 to 20.

Figure 11A:
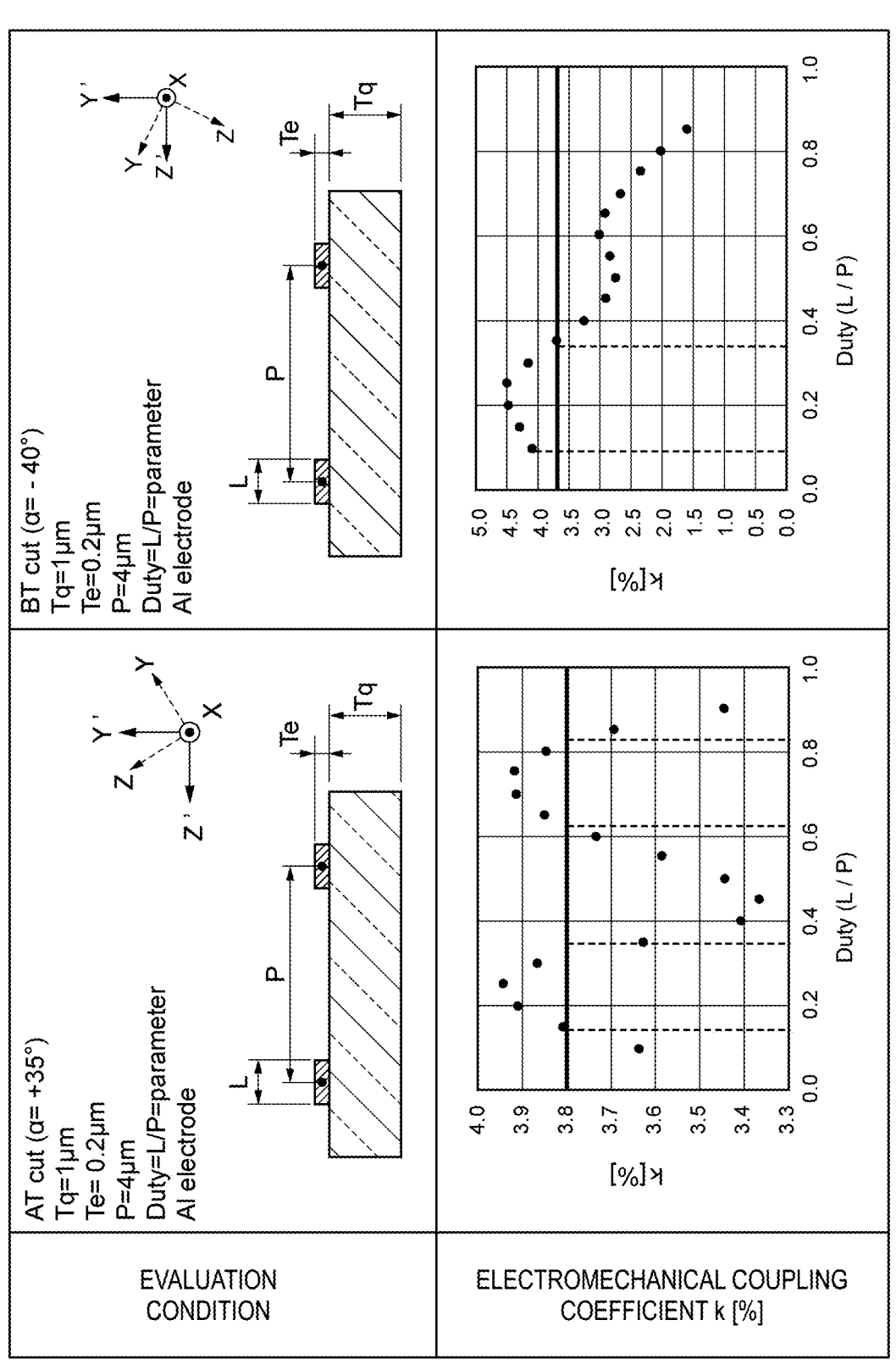
FIG. 11A is a drawing illustrating a relationship between cut-angle, duty ratio, and characteristics.
Figure 11B:
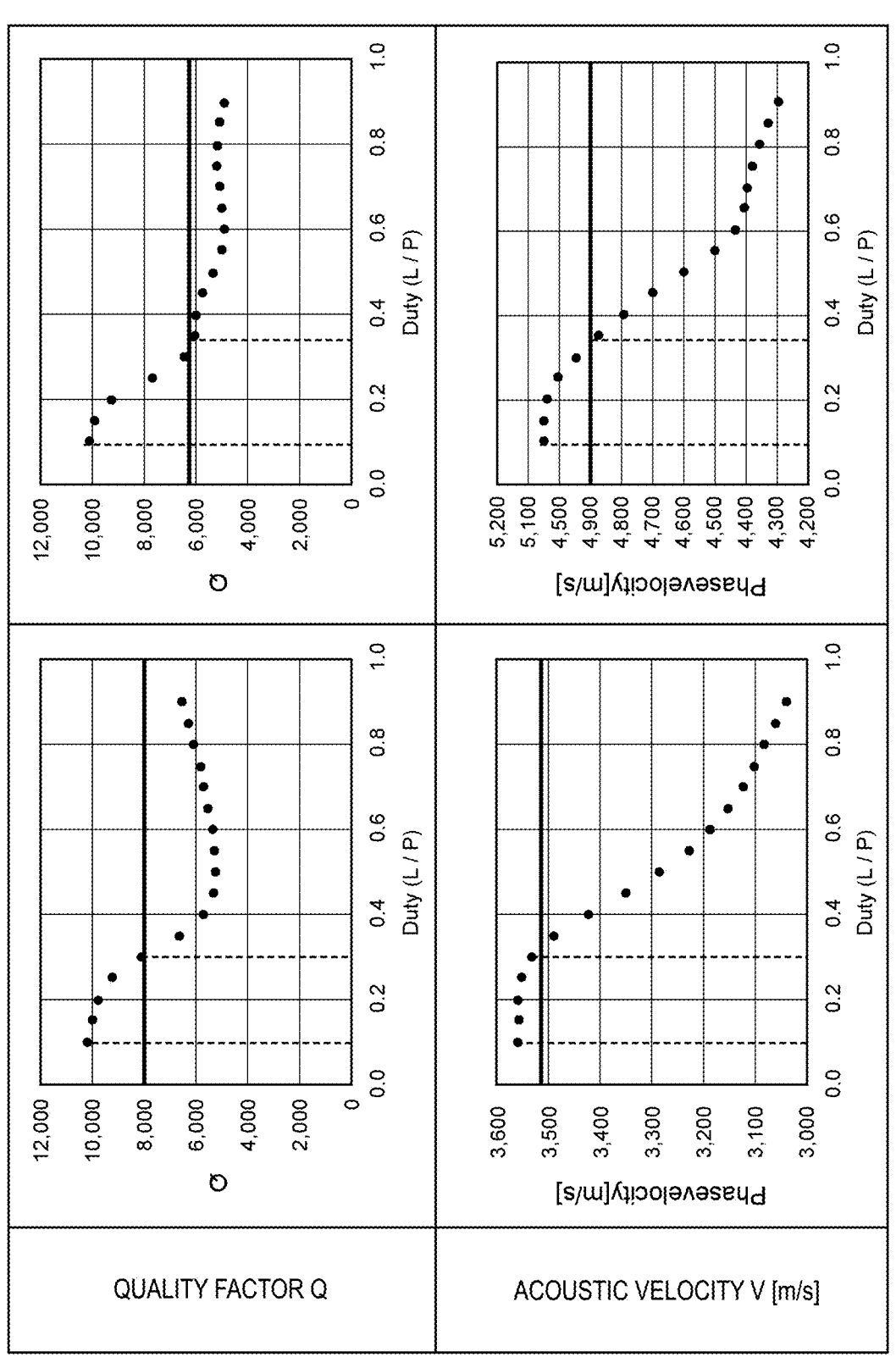
FIG. 11B is a drawing illustrating a relationship between offset ratio and distortion energy density.

FIG. 11A and FIG. 11B show graphs indicating a relationship between a duty ratio and each characteristic for cases of an AT-cut crystal substrate (α=+35°) and a BT-cut crystal substrate (α=−40°). FIG. 11A shows evaluation condition and electromechanical coupling coefficient k in order from the top, and FIG. 11B shows quality factor Q and acoustic velocity V in order from the top. The followings are evaluation conditions in FIG. 11A and FIG. 11B other than the cut-angle:

Electrode arrangement: first embodiment.
Thickness Tq of crystal substrate=1 μm.
Thickness Te of electrode=0.2 μm.
Pitch P=4 μm
Duty ratio Duty=variable (horizontal axis of graph)
Material of electrode finger: Al In the case of the AT-cut crystal substrate, when the duty ratio Duty is from 0.15 to 0.33 inclusive or from 0.62 to 0.82 inclusive, the electromechanical coupling coefficient k is 3.8% or higher. When the duty ratio Duty is from 0.10 to 0.30 inclusive, the quality factor Q is 8000 or higher and the acoustic velocity V is 3500 m/s or higher. Accordingly, when the duty ratio Duty is from 0.15 to 0.30 inclusive, a crystal resonator whose electromechanical coupling coefficient k, quality factor Q, and acoustic velocity V are all high can be obtained. Considering the tolerances in the manufacturing process of the crystal resonator, the duty ratio Duty is preferably within the range of 0.25±10%. Accordingly, a crystal resonator whose electromechanical coupling coefficient k, quality factor Q, and acoustic velocity V are all high can be more securely obtained.

In the case of the BT-cut crystal substrate, when the duty ratio Duty is from 0.10 to 0.33 inclusive, the electromechanical coupling coefficient k is 3.6% or higher, the quality factor Q is 6100 or higher, and the acoustic velocity is 4900 m/s or higher. Accordingly, when the duty ratio Duty is from 0.10 to 0.33 inclusive, a crystal resonator whose electromechanical coupling coefficient k, quality factor Q, and acoustic velocity V are all high can be obtained. Considering the tolerances in the manufacturing process of the crystal resonator, the duty ratio Duty is preferably within the range of 0.25±10%. Accordingly, a crystal resonator whose electromechanical coupling coefficient k, quality factor Q, and acoustic velocity V are all high can be more securely obtained.

Figure 12:
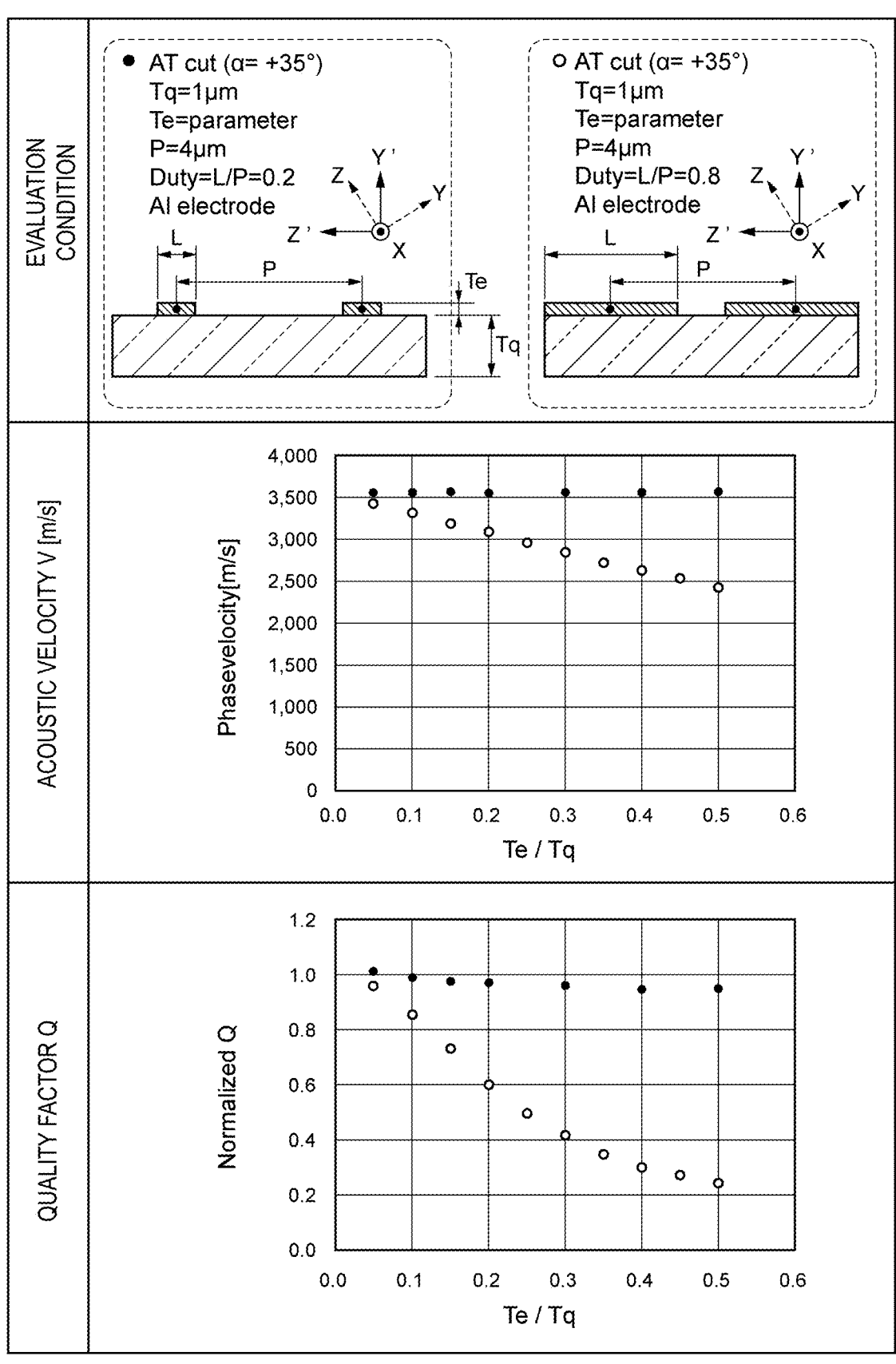
FIG. 12 is a drawing illustrating a relationship between duty ratio, film thickness ratio of electrode, and characteristics.

FIG. 12 shows graphs indicating a relationship between a ratio of thickness of an electrode finger with respect to thickness of a crystal substrate (hereinafter, referred to as an "electrode film thickness ratio") Te/Tq and the acoustic velocity V, and a relationship between the electrode film thickness ratio Te/Tq and the quality factor Q for the cases of the duty ratio Duty=0.2 and the duty ratio Duty=0.8. The acoustic velocity V and the quality factor Q are shown in order from the top. The followings are evaluation conditions in FIG. 12 other than the duty ratio:

Electrode arrangement: first embodiment.
Cut-angle: AT-cut ($\alpha$=+35°)
Thickness Tq of crystal substrate=1 μm.
Thickness Te of electrode=variable.
Pitch P=4 μm
Material of electrode finger: Al In the case of Duty=0.2, even when the electrode film thickness ratio Te/Tq increased, the acoustic velocity V and the quality factor Q hardly decreased. On the other hand, in the case of the duty ratio Duty=0.8, when the electrode film thickness ratio Te/Tq increased, the acoustic velocity V and the quality factor Q largely decreased compared to the case of the duty ratio Duty=0.2. Accordingly, from the point that decreases in the acoustic velocity V and the quality factor Q can be suppressed in decrease of the thickness of the crystal substrate, the duty ratio Duty of 0.15 or higher and 0.33 is preferable to that from 0.62 to 0.82 inclusive. The thickness of the crystal substrate is inversely proportional to frequency and therefore, a crystal resonator whose duty ratio Duty is from 0.15 to 0.33 inclusive is suitable for increase in frequency.

Figure 13:
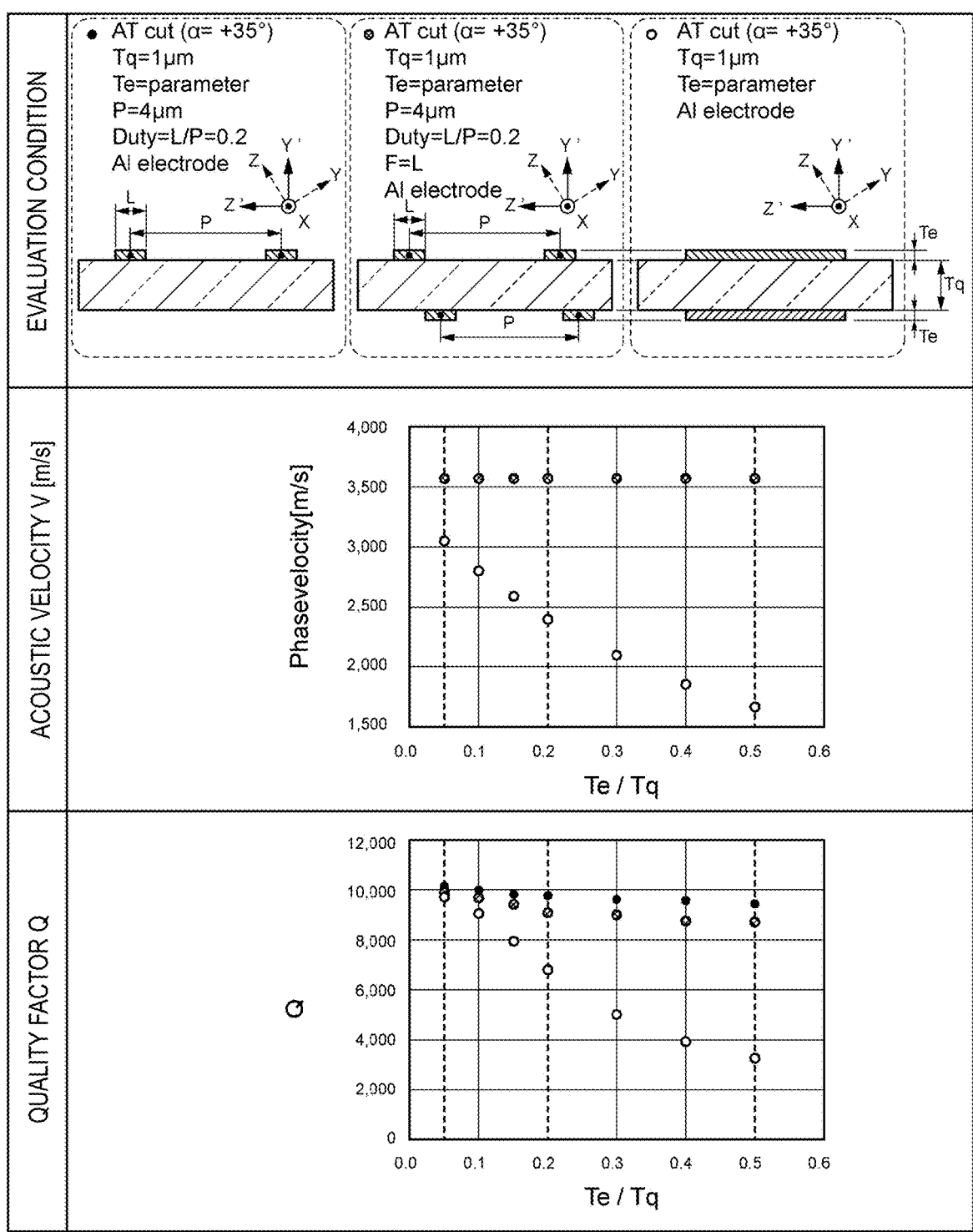
FIG. 13 is a drawing illustrating a relationship between electrode arrangement, film thickness ratio of electrode, and characteristics.

FIG. 13 shows graphs indicating a relationship between the electrode film thickness ratio Te/Tq and the acoustic velocity V and a relationship between the electrode film thickness ratio Te/Tq and the quality factor Q for the cases of the electrode arrangement of the first embodiment, the electrode arrangement of the second embodiment, and the electrode arrangement of the comparative configuration. The acoustic velocity V and the quality factor Q are shown in order from the top. The followings are evaluation conditions in FIG. 13 other than the electrode arrangement:

Cut-angle: AT-cut ($\alpha$=+35°)
Thickness Tq of crystal substrate=1 μm
Thickness Te of electrode=variable
Pitch P=4 μm (the electrode arrangements of the first embodiment and the second embodiment)
Duty ratio Duty=0.2 (the electrode arrangements of the first embodiment and the second embodiment)
Material of electrode finger: Al In the case of the electrode arrangement of the comparative configuration, when the electrode film thickness ratio Te/Tq increased in the range from 0.05 to 0.5 inclusive, the acoustic velocity V and the quality factor Q largely decreased. On the other hand, in the case of the electrode arrangement of the first embodiment, even when the electrode film thickness ratio Te/Tq increased in the range from 0.05 to 0.5 inclusive, the acoustic velocity V and the quality factor Q hardly decreased. In the case of the electrode arrangement of the second embodiment, even when the electrode film thickness ratio Te/Tq increased in the range from 0.05 to 0.5 inclusive, the quality factor Q hardly decreased. The acoustic velocity V in the case of the electrode arrangement of the second embodiment is larger than the acoustic velocity V in the case of the electrode arrangement of the comparative configuration in the range of the electrode film thickness ratio Te/Tq from 0.05 to 0.5 inclusive. The quality factors Q in the cases of the electrode arrangements of the first and second embodiments are larger than the quality factor Q in the case of the electrode arrangement of the comparative configuration in the range of the electrode film thickness ratio Te/Tq from 0.2 to 0.5 inclusive.

Figure 14:
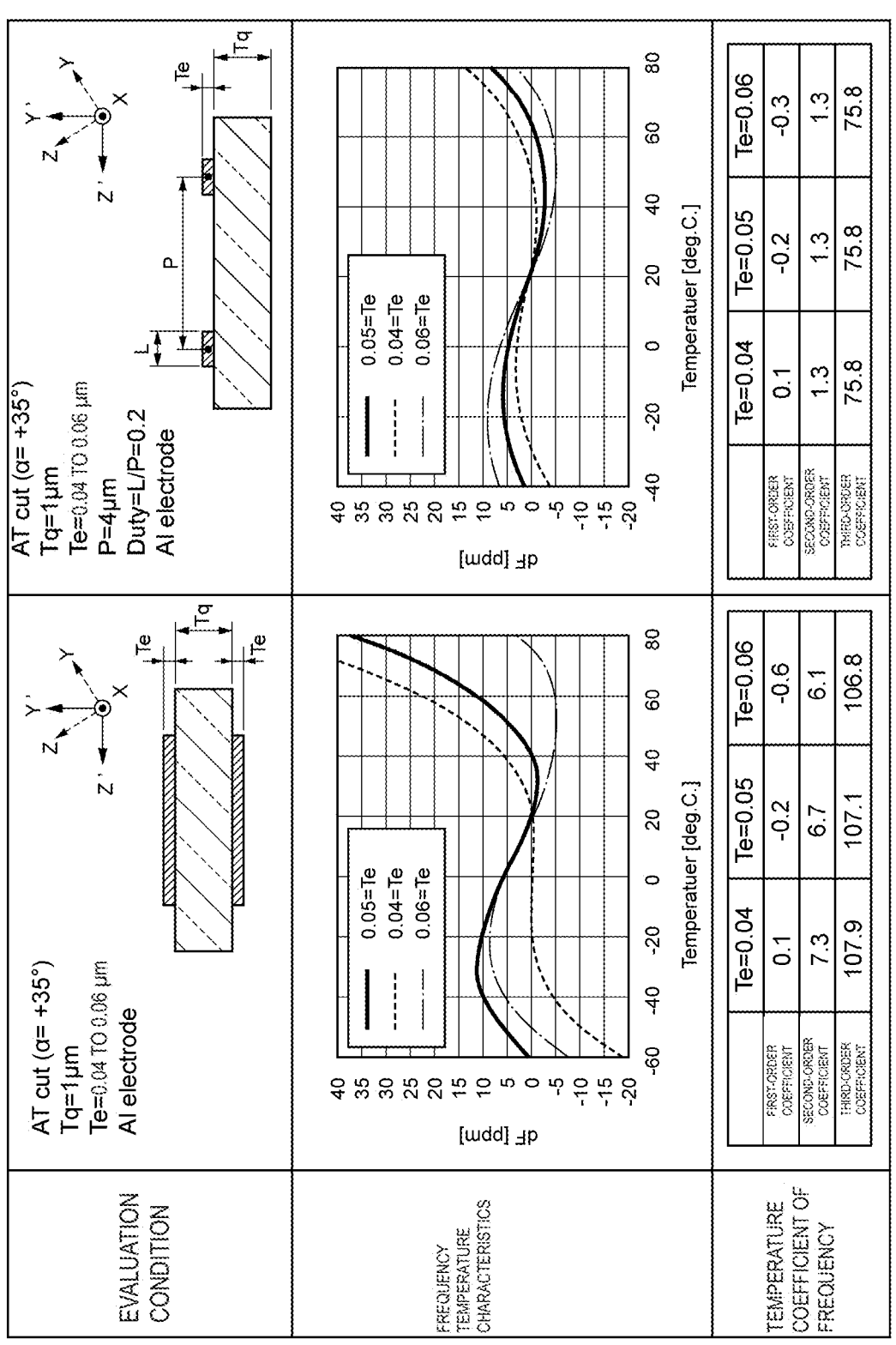
FIG. 14 is a drawing illustrating frequency temperature characteristics.

FIG. 14 shows graphs of frequency temperature characteristics and tables of temperature coefficients of frequency for the cases of the electrode arrangement of the comparative configuration and the electrode arrangement of the first embodiment. The followings are evaluation conditions in FIG. 14 other than the electrode arrangement:

Cut-angle: AT-cut ($\alpha$=+35°)
Thickness Tq of crystal substrate=1 μm.
Thickness Te of electrode=0.04 μm to 0.06 μm
Pitch P=4 μm (the electrode arrangement of the first embodiment)
Duty ratio Duty=0.2 (the electrode arrangement of the first embodiment)
Material of electrode finger: Al Distortion at the electrode or a portion of the crystal substrate which is in contact with the electrode is large in the comparative configuration and therefore, the frequency temperature characteristics are affected by the electrode and largely varied. On the other hand, distortion at the electrode or a portion of the crystal substrate which is in contact with the electrode is small in the first embodiment and therefore, variation in the frequency temperature characteristics caused by the influence of the electrode is small. Especially when the electrode film thickness ratio Te/Tq is increased for increase in frequency, the second-order and third-order coefficients, which tend to increase when affected by electrodes, are smaller in the first embodiment than in the comparative configuration. In the range of Te=0.04 μm to 0.06 μm, while the second-order coefficient in the comparative configuration is from 7.3 to 6.1, the second-order coefficient in the first embodiment is 1.3. Similarly, while the third-order coefficient in the comparative configuration is from 107.9 to 106.8, the third-order coefficient in the first embodiment is 75.8. Accordingly, variation in the frequency temperature characteristics caused by deviation of the electrode film thickness is smaller in the first embodiment than in the comparative configuration.

Figure 15A:
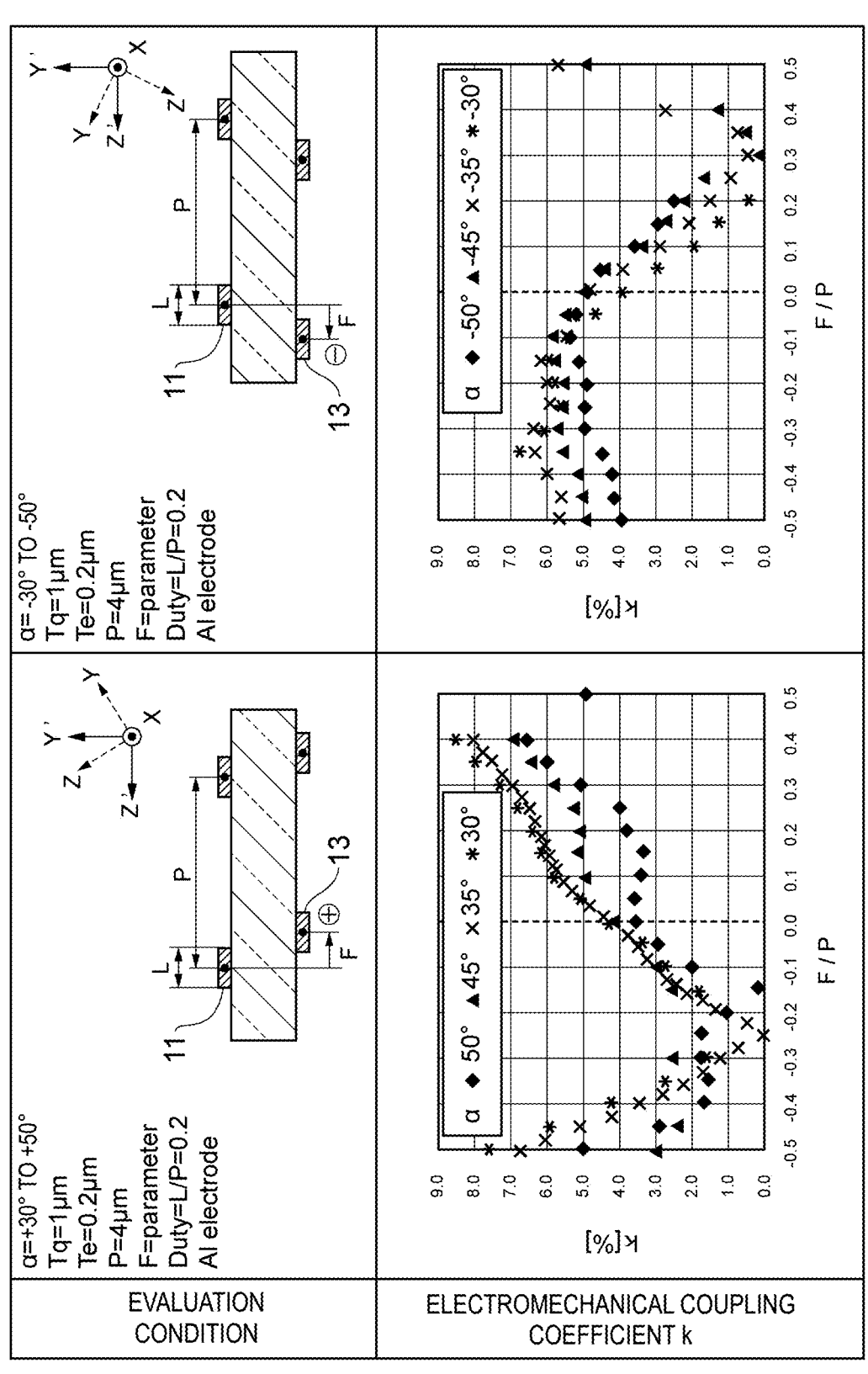
FIG. 15A is a drawing illustrating a relationship between cut-angle, offset ratio, and electromechanical coupling coefficient.
Figure 15B:
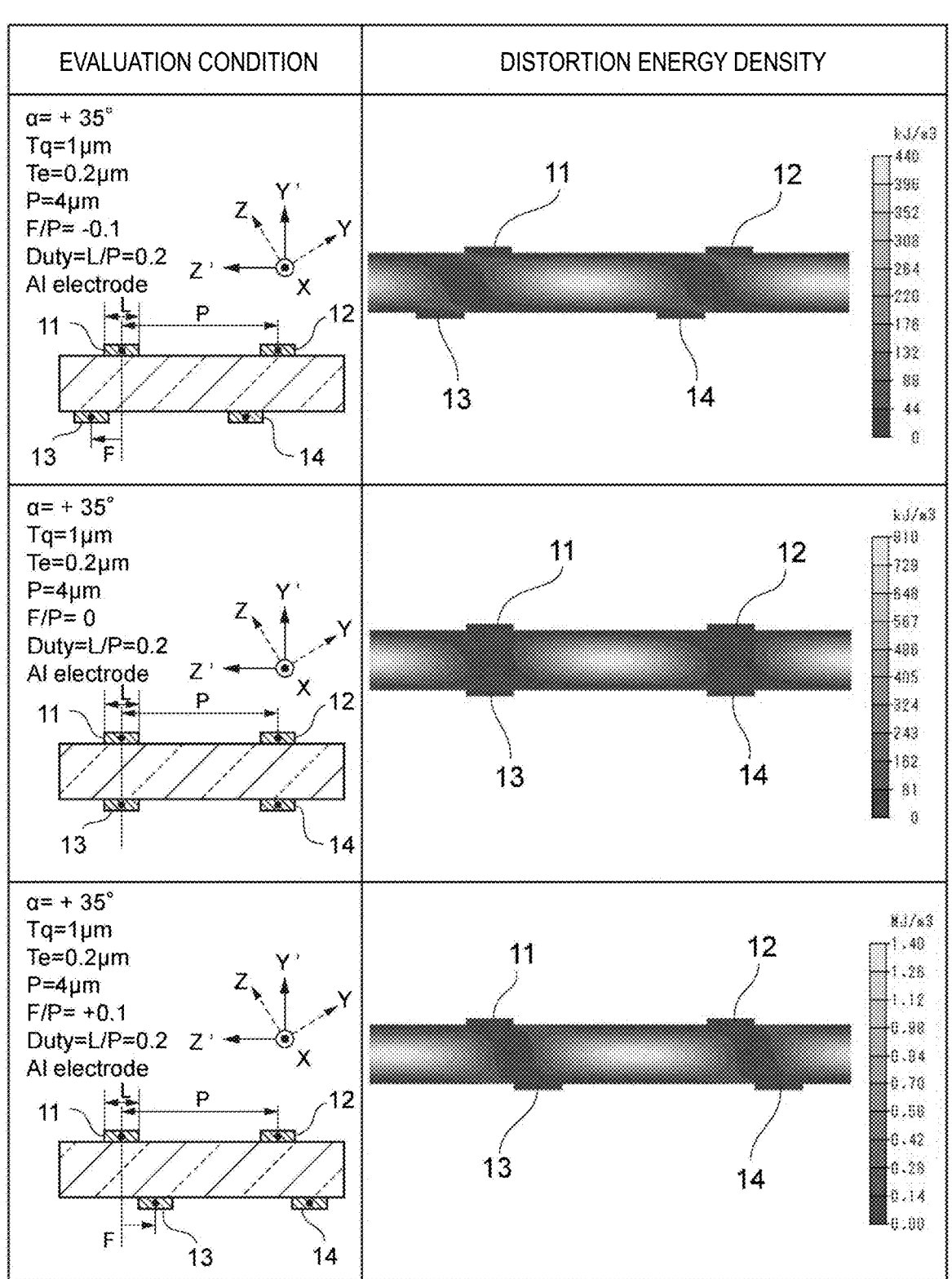
FIG. 15B is a sectional view illustrating distortion energy density of each case of offset ratio F/P=−0.1, F/P=0, and F/P=+0.1 when α=+35° is established in the second exemplary embodiment.

FIG. 15A shows graphs indicating a relationship between a ratio of offset F with respect to the pitch P (hereinafter referred to as an "offset ratio") F/P and the electromechanical coupling coefficient k for the cases where a crystal substrate has a rotation angle $\alpha=+30°$ to 50° near AT and where a crystal substrate has a rotation angle $\alpha=-30°$ to $-50°$ near BT-cut. FIG. 15B is a sectional view illustrating distortion energy density of each case of the offset ratio F/P=−0.1, F/P=0, and F/P=+0.1 when $\alpha=+35°$ is established in the second embodiment. The followings are evaluation conditions in FIG. 15A and FIG. 15B other than the rotation angle $\alpha$:

Thickness Tq of crystal substrate=1 μm
Thickness Te of electrode=0.2 μm.
Pitch P=4 μm.
Duty ratio Duty=0.2
Material of electrode finger: Al For the rotation angle $\alpha=+30°$ to 50°, the electromechanical coupling coefficient k decreases when the offset ratio F/P is lower than 0, and the electromechanical coupling coefficient k increases when the offset ratio F/P is higher than 0, compared to the electromechanical coupling coefficient k obtained when the offset ratio F/P is 0. The electromechanical coupling coefficient k decreases when an electrode is arranged in a region having large distortion. Conversely, for the rotation angle $\alpha=-30°$ to $-50°$, the electromechanical coupling coefficient k increases when the offset ratio F/P is lower than 0, and the electromechanical coupling coefficient k decreases when the offset ratio F/P is higher than 0, compared to the electromechanical coupling coefficient k obtained when the offset ratio F/P is 0. Accordingly, the electromechanical coupling coefficient k can be increased when the second main surface 10B is positioned on the negative direction side of the Y axis with respect to the first main surface 10A and the central axis of the third electrode finger 13 is positioned on the positive direction side of the Y axis projected onto the second main surface 10B with respect to the central axis of the first electrode finger 11. For purposes of this disclosure and according to the exemplary aspect, "Y axis direction projected onto the second main surface 10B" is a Z'-axis-direction component obtained when the Y axis is decomposed into a Z'-axis-direction component and a Y'-axis-direction component. Specifically, the "positive direction side of the Y axis projected onto the second main surface 10B" is the negative direction side of the Z' axis when the rotation angle $\alpha$ is positive, and is the positive direction side of the Z' axis when the rotation angle $\alpha$ is negative. Further, the electromechanical coupling coefficient k can be increased by providing the first electrode finger 11, the second electrode finger 12, the third electrode finger 13, and the fourth electrode finger 14 in a region in which distortion of the crystal substrate 10 is 10% or lower of the maximum distortion.

Figure 16:
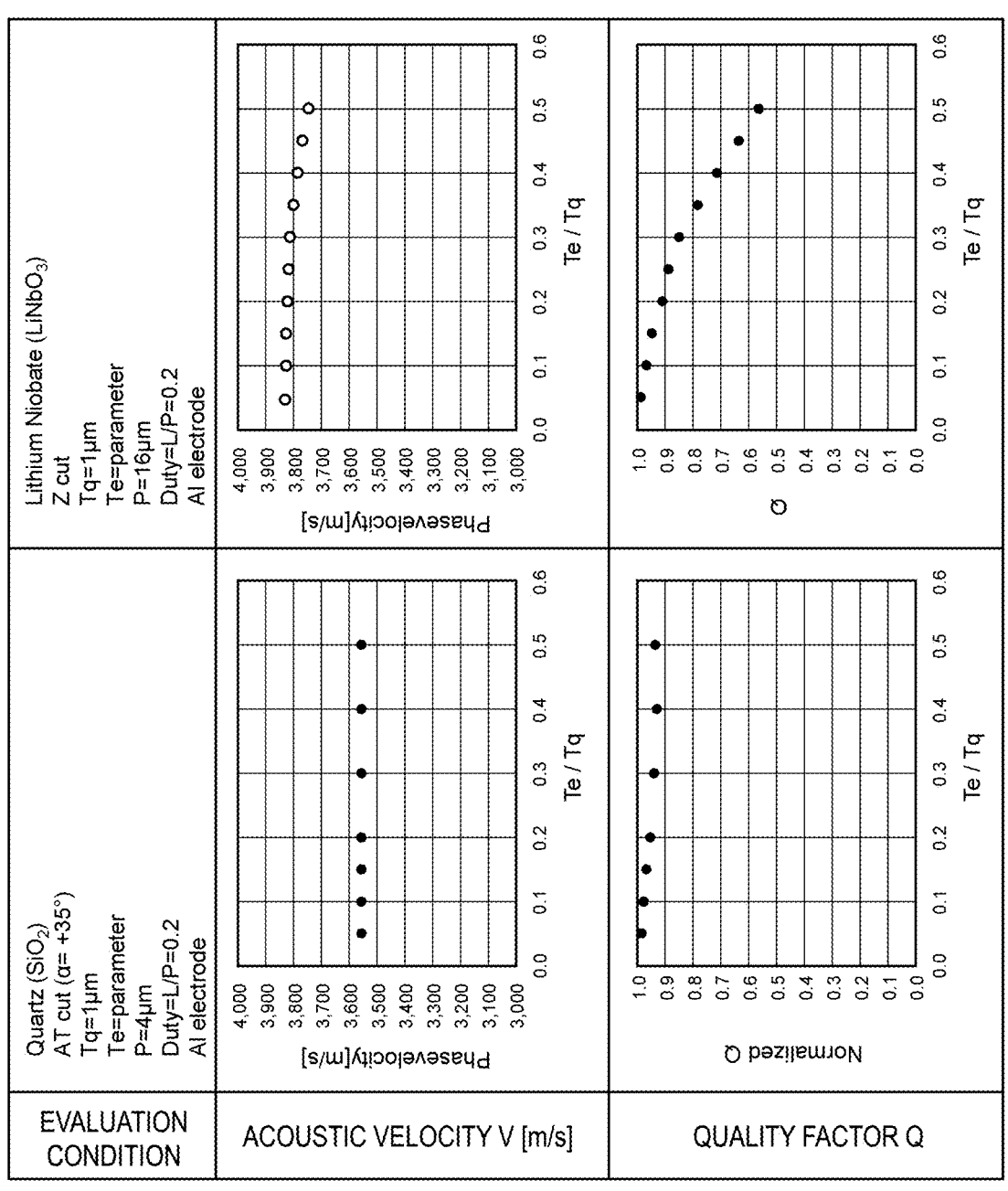
FIG. 16 is a drawing illustrating a relationship between material of piezoelectric substrate, film thickness ratio of electrode, and characteristics.

FIG. 16 shows characteristic comparison between the case in which the crystal substrate is AT-cut ($\alpha=+35°$ in the first embodiment and the case in which a Z-cut lithium niobate ($LiNbO_3$) substrate is used instead of the crystal substrate in the first embodiment. FIG. 16 shows graphs indicating a relationship between the electrode film thickness ratio Te/Tq and the acoustic velocity V, and a relationship between the electrode film thickness ratio Te/Tq and the quality factor Q. The followings are evaluation conditions in FIG. 16 other than the above:

Thickness Tq of crystal substrate or lithium niobate substrate=1 μm.

Thickness Te of electrode=variable.
Pitch P for crystal substrate=4 μm.
Pitch P for lithium niobate substrate=16 μm.
Duty ratio Duty=0.2
Material of electrode finger: Al In the configuration using the lithium niobate substrate, the acoustic velocity V and the quality factor Q are more decreased in increase of the electrode film thickness ratio Te/Tq, compared to the configuration using the crystal substrate. Thus, it is hard to obtain the advantageous effects of the present invention in the configuration using a piezoelectric material other than a crystal substrate, while the advantageous effects of the present invention can be obtained in the configuration using a crystal substrate.

Figure 17A:
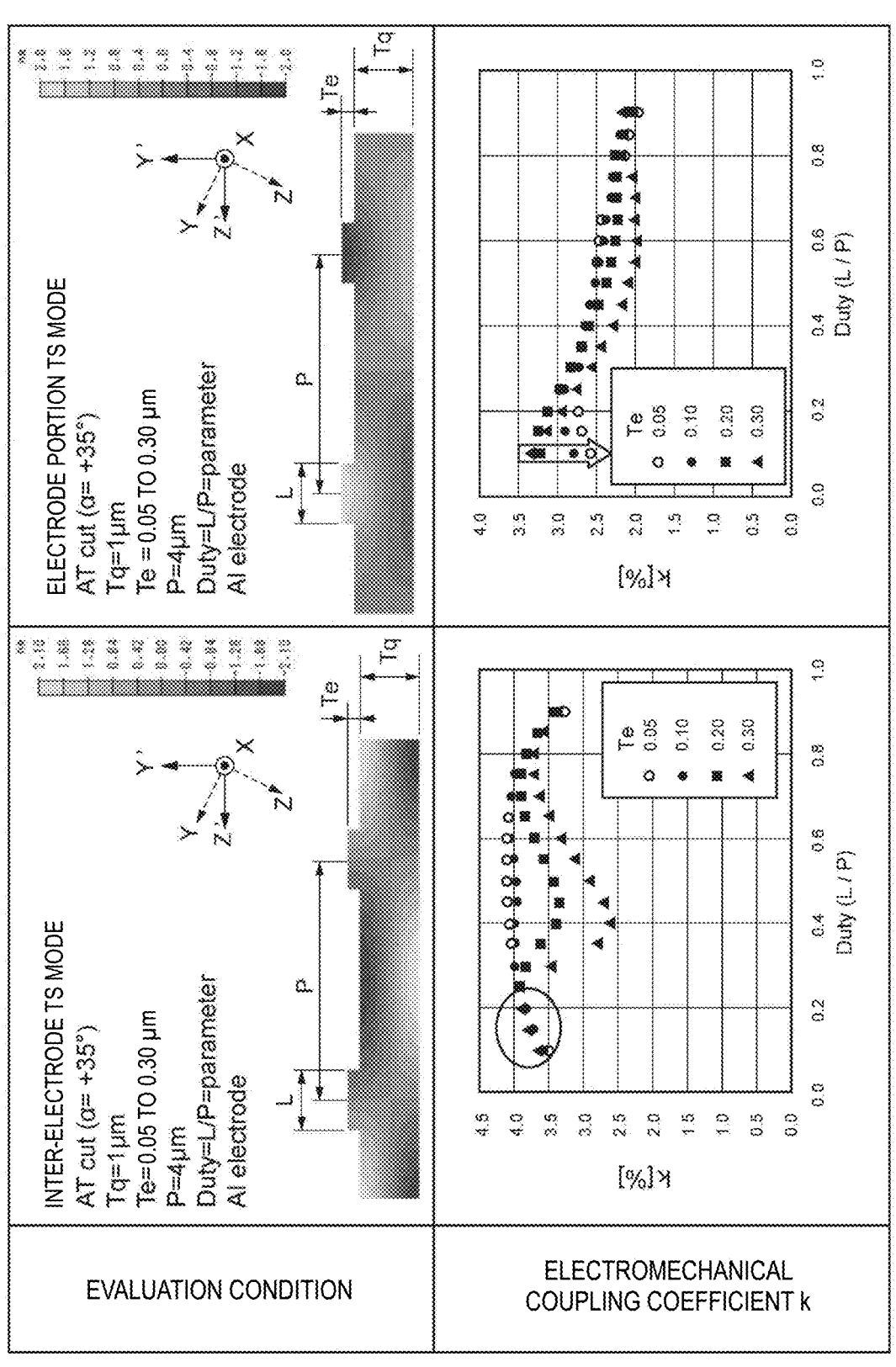
FIG. 17A is a drawing illustrating a relationship between material of piezoelectric substrate, duty ratio, and characteristics.
Figure 17B:
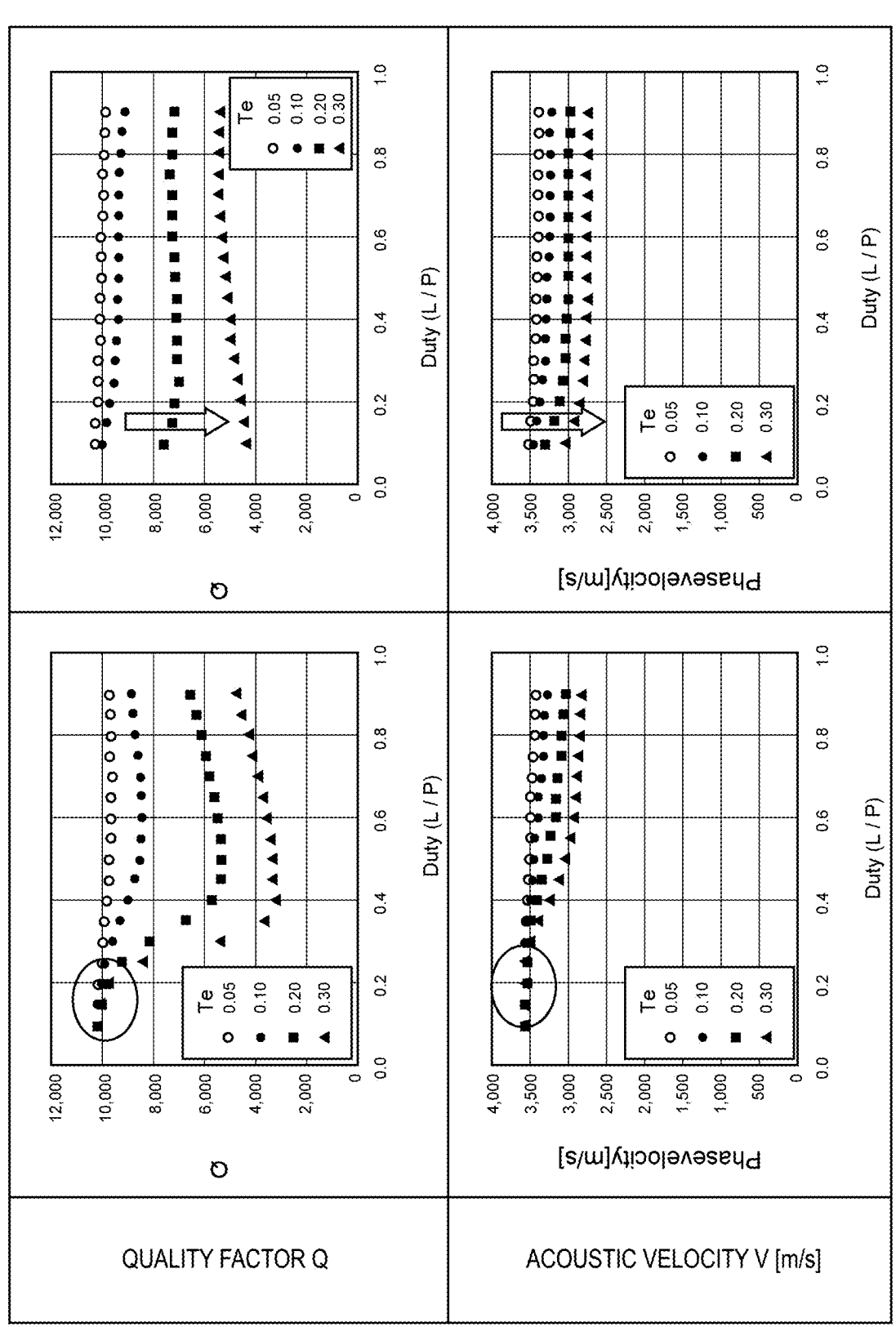
FIG. 17B is a drawing illustrating the relationship between the material of piezoelectric substrate, the duty ratio, and the characteristics.
Figure 18A:
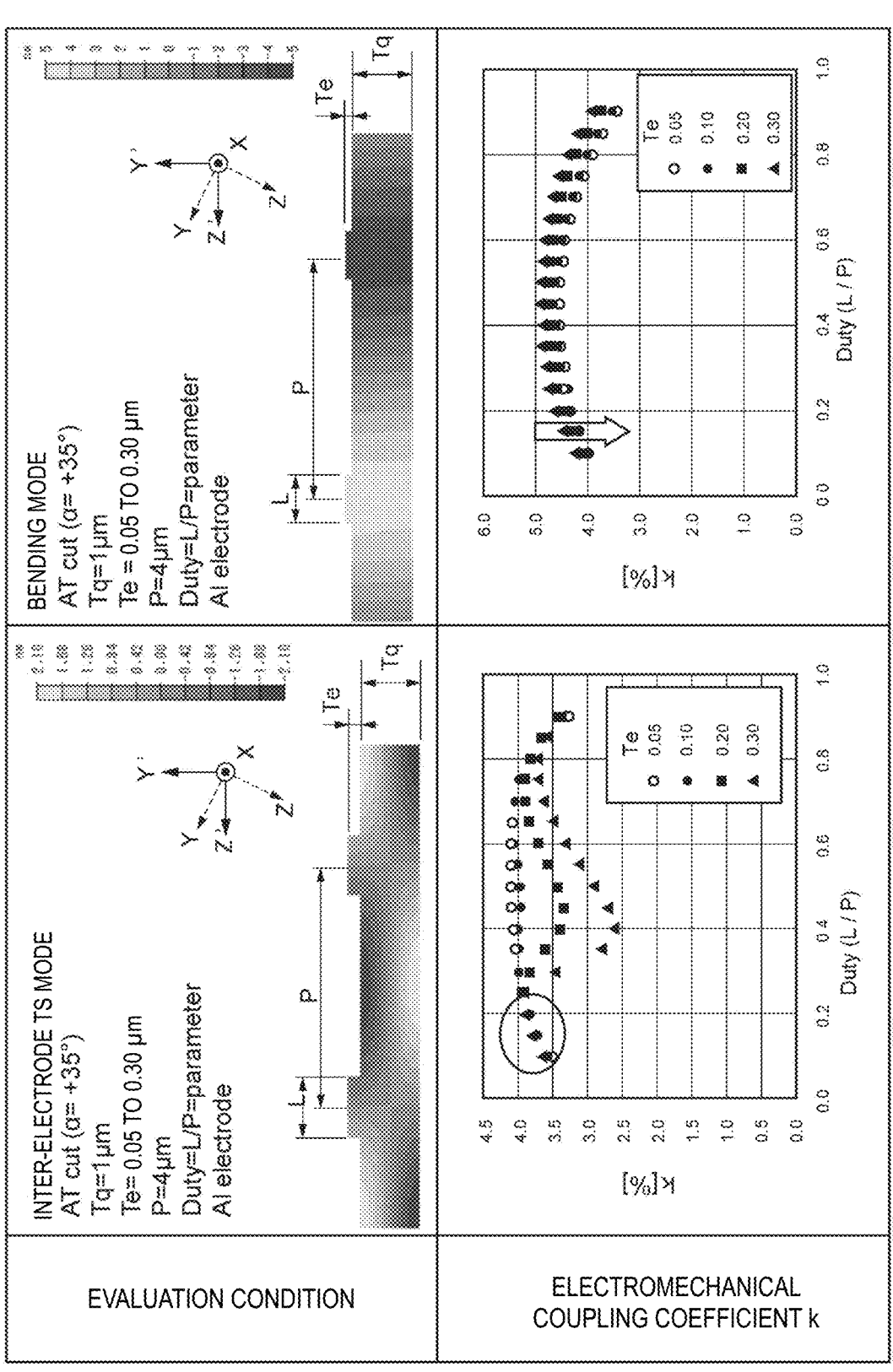
FIG. 18A is a drawing illustrating a relationship between vibration mode, duty ratio, and characteristics.
Figure 18B:
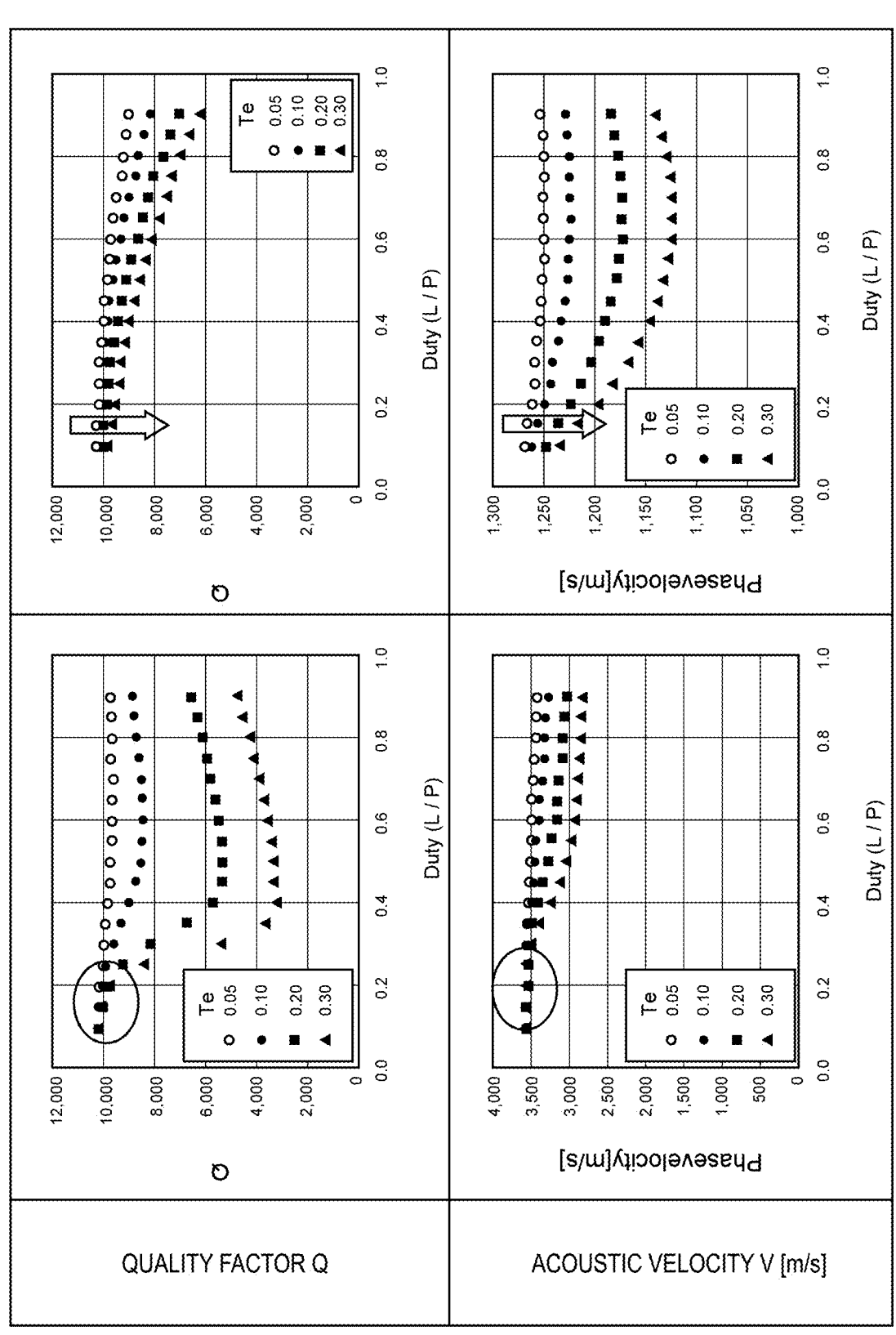
FIG. 18B is a drawing illustrating the relationship between the vibration mode, the duty ratio, and the characteristics.

FIG. 17A and FIG. 17B show characteristic comparison between the case of a thickness shear vibration mode in which displacement becomes maximum at a portion overlapping with a gap between electrode fingers in the Y' axis direction and the case of a thickness shear vibration mode in which displacement becomes maximum at a portion overlapping with an electrode finger in the Y' axis direction. In the drawings, the former is described as an "inter-electrode TS mode" and the latter is described as an "electrode portion TS mode". FIG. 18A and FIG. 18B show characteristic comparison between the case of a thickness shear vibration mode in which displacement becomes maximum at a portion overlapping with a gap between electrode fingers in the Y' axis direction and the case of a bending vibration mode. In the drawings, the former is described as an "inter-electrode TS mode" and the latter is described as a "bending mode". FIG. 17A and FIG. 18A show evaluation condition and electromechanical coupling coefficient k in order from the top, and FIG. 17B and FIG. 18B show quality factor Q and acoustic velocity V in order from the top. The followings are evaluation conditions in FIG. 17A, FIG. 17B, FIG. 18A, and FIG. 18B other than the vibration mode:

Cut-angle: AT-cut ($\alpha=+35°$)
Thickness Tq of crystal substrate=1 μm
Thickness Te of electrode=0.05 μm to 0.30 μm.
Pitch P=4 μm
Duty ratio Duty=variable
Material of electrode finger: Al In the thickness shear vibration mode in which displacement becomes maximum at a portion overlapping with an electrode finger in the Y' axis direction, each characteristic degrades when the duty ratio Duty is from 0.15 to 0.30 inclusive along with increase of the thickness Te of electrode. In the bending vibration mode as well, each characteristic degrades when the duty ratio Duty is from 0.15 to 0.30 inclusive along with increase of the thickness Te of electrode. On the other hand, in the thickness shear vibration mode in which displacement becomes maximum at a portion overlapping with a gap between electrode fingers in the Y' axis direction, each characteristic hardly degrades when the duty ratio Duty is from 0.15 to 0.30 inclusive even in increase of the thickness Te of electrode. Degradation of each characteristic is further suppressed when the duty ratio Duty is 0.15 or higher and 0.25. As a result, according to the exemplary embodiment, the electromechanical coupling coefficient k, the quality factor Q, and the acoustic velocity V can be increased even with electrodes having large thickness.

Figure 19A:
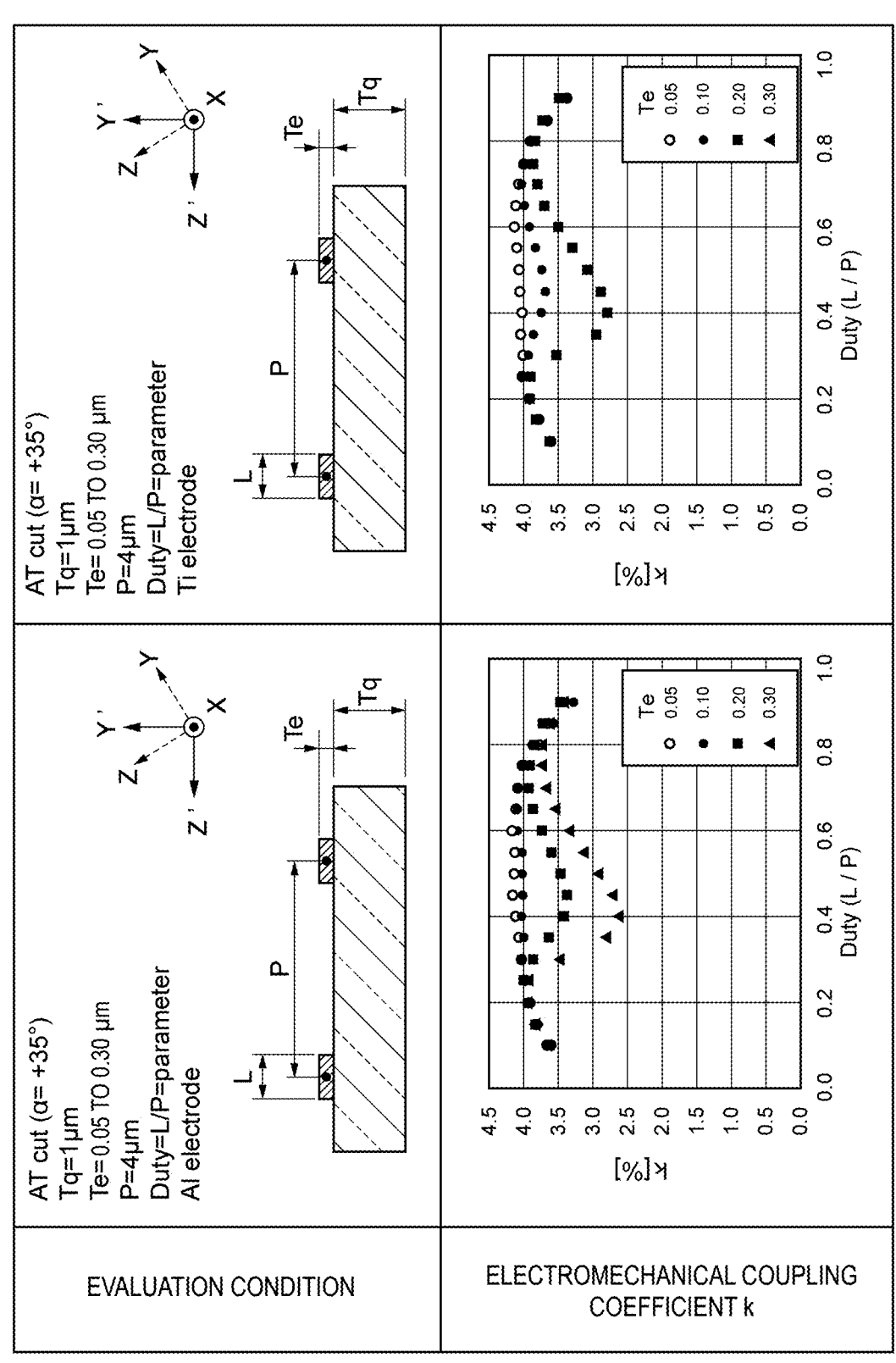
FIG. 19A is a drawing illustrating a relationship between material of electrode, film thickness ratio of electrode, and characteristics.
Figure 19B:
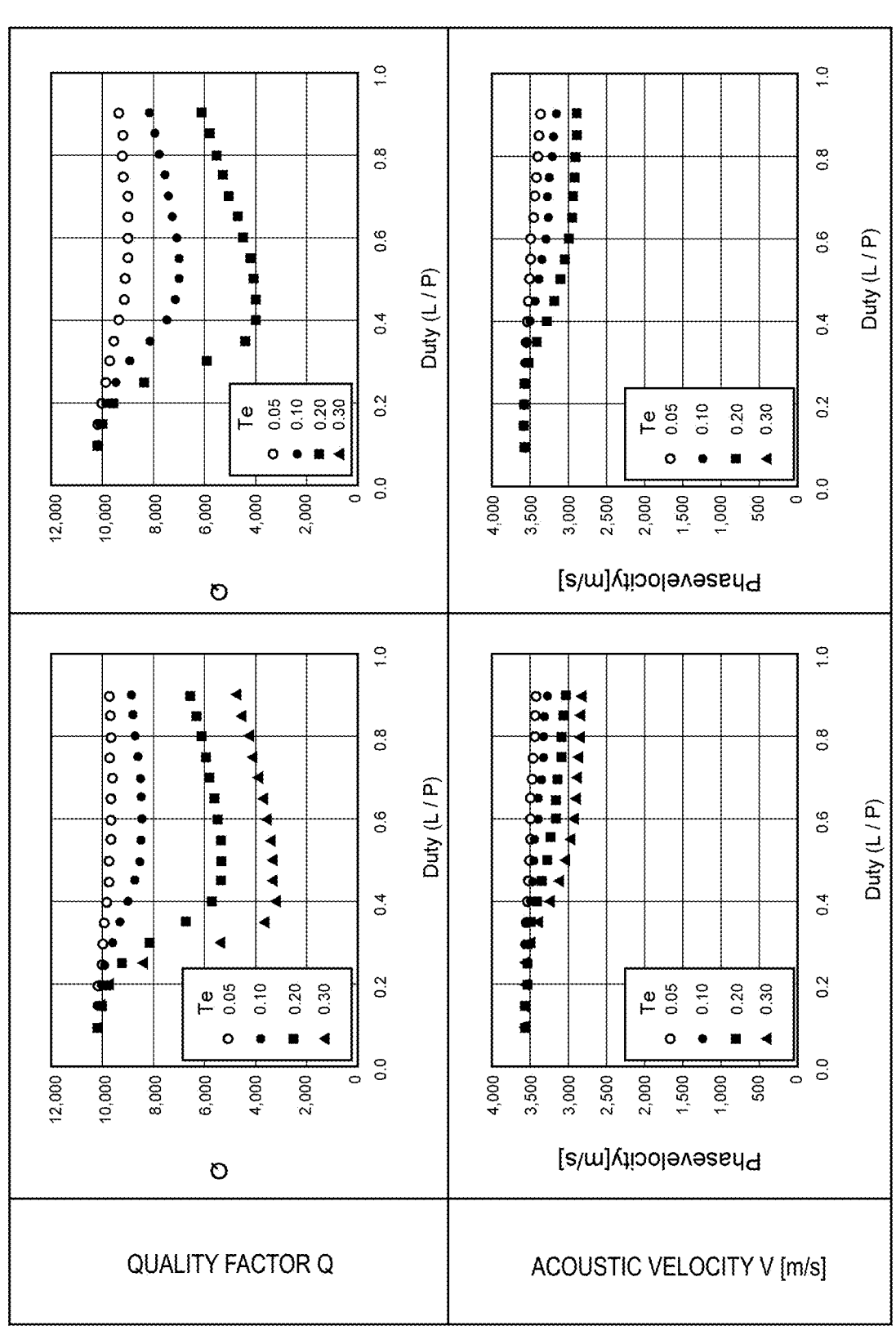
FIG. 19B is a drawing illustrating the relationship between the material of electrode, the film thickness ratio of electrode, and the characteristics.
Figure 20A:
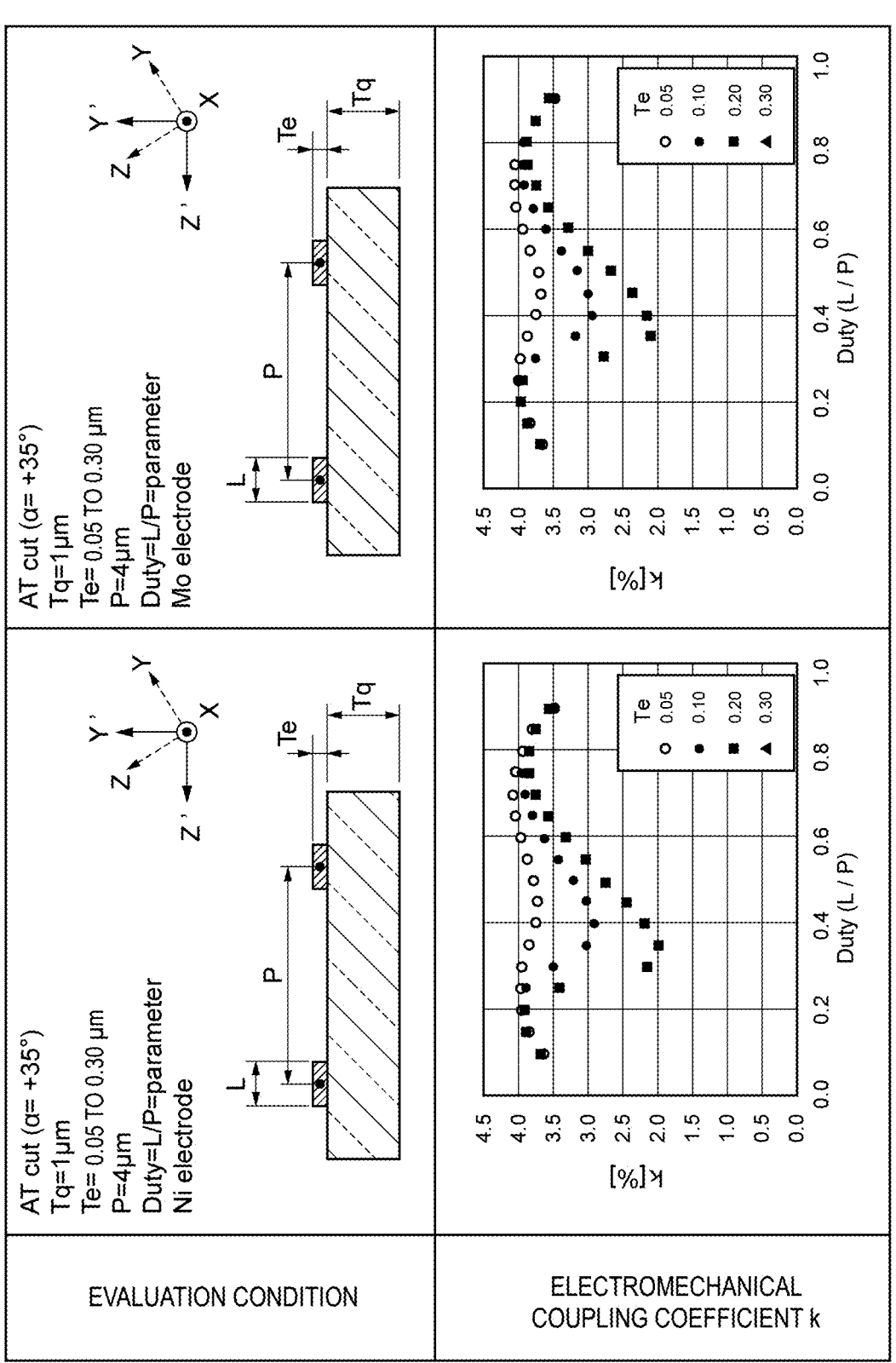
FIG. 20A is a drawing illustrating a relationship between material of electrode, film thickness ratio of electrode, and characteristics.
Figure 20B:
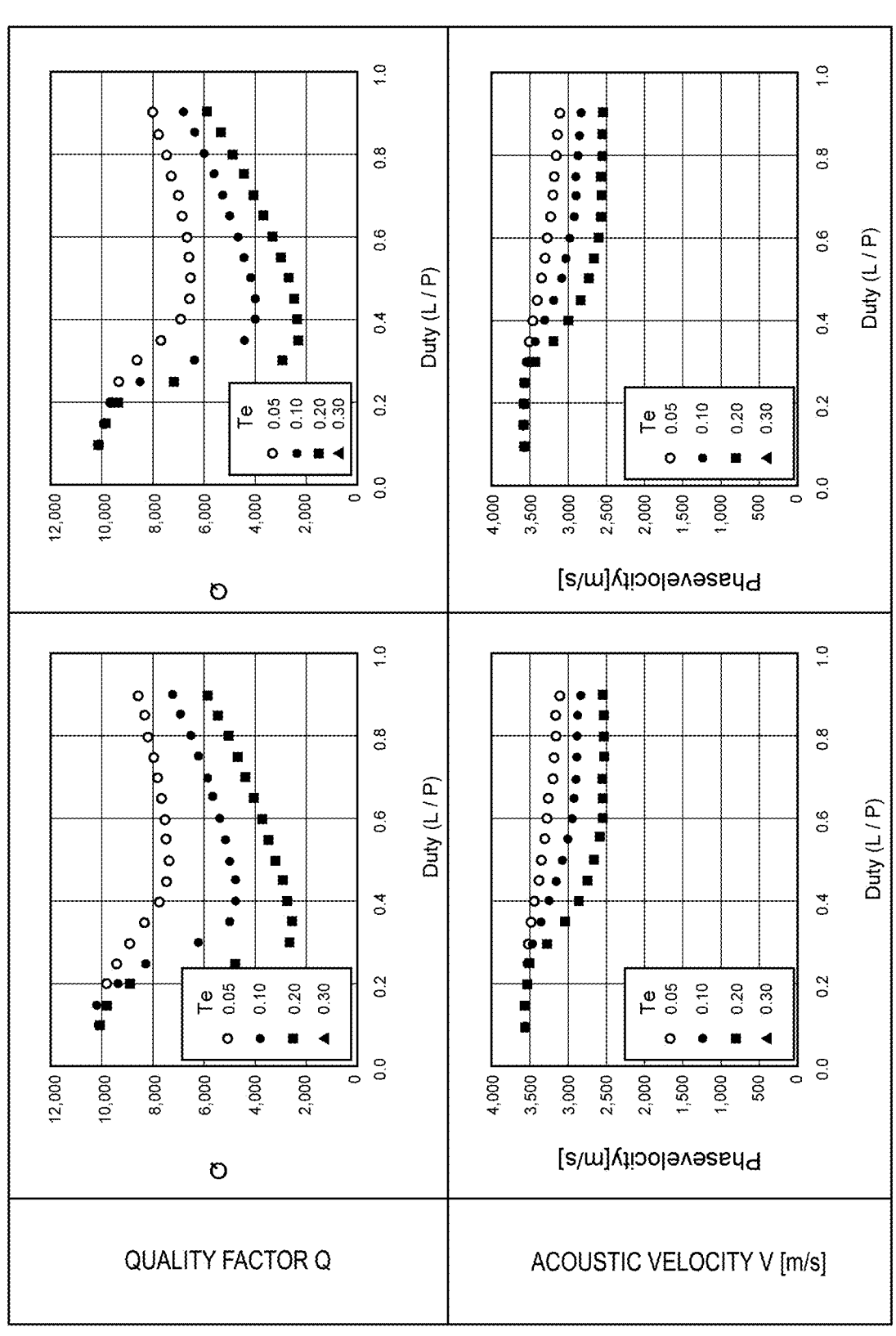
FIG. 20B is a drawing illustrating the relationship between the material of electrode, the film thickness ratio of electrode, and the characteristics.

FIG. 19A and FIG. 19B show characteristic comparison between an electrode finger made of Al and an electrode finger made of Ti. FIG. 20A and FIG. 20B show characteristic comparison between an electrode finger made of Ni and an electrode finger made of Mo. FIG. 19A and FIG. 20A show evaluation condition and electromechanical coupling coefficient k in order from the top, and FIG. 19B and FIG. 20B show quality factor Q and acoustic velocity V in order from the top. The followings are evaluation conditions in FIG. 19A, FIG. 19B, FIG. 20A, and FIG. 20B other than the material of electrode finger:

Electrode arrangement: first embodiment
    Cut-angle: AT-cut (α=+35°)
    Thickness Tq of crystal substrate=1 μm
    Thickness Te of electrode=0.05 μm to 0.30 μm.
    Pitch P=4 μm
    Duty ratio Duty=variable Whether the electrode finger was made of Al, Ti, Ni, or Mo, each characteristic showed a similar trend. According to the exemplary embodiment, the advantageous effects of the present invention can be obtained irrespective of a material of an electrode.

The exemplary embodiments of the present invention have been described thus far. Next, part or all of embodiments of the present invention will be appended below. However, it is noted that the exemplary embodiments of the present invention are not limited to the following appended notes.

A crystal resonator according to an exemplary aspect includes a crystal substrate that has a first main surface and a second main surface that is opposed to the first main surface; a first comb electrode that is provided on the first main surface of the crystal substrate; and a second comb electrode that is provided on the first main surface of the crystal substrate. Each of the first and second comb electrodes include a plurality of electrode fingers that are alternately arranged in a manner to be separated from each other. The plurality of electrode fingers of the first comb electrode include a first electrode finger. The plurality of electrode fingers of the second comb electrode include a second electrode finger that is adjacent to the first electrode finger. Thickness shear vibration is excited at a portion overlapping with a gap between the first electrode finger and the second electrode finger, depending on a potential difference between the first electrode finger and the second electrode finger. L1 is a width of the first electrode finger, L2 is a width of the second electrode finger, and P1 is a distance between the first electrode finger and the second electrode finger in a direction in which the first electrode finger and the second electrode finger are arranged. Moreover, a duty ratio (L1+L2)/(2×P1) on a first main surface side is from 0.15 to 0.33 inclusive or from 0.62 to 0.82 inclusive.

Accordingly, a favorable electromechanical coupling coefficient can be obtained.

In an exemplary aspect, the width L1 of the first electrode finger and the width L2 of the second electrode finger may be equal to each other.

In an exemplary aspect, the first main surface and the second main surface may displace in a direction parallel to the first electrode finger and the second electrode finger along with the thickness shear vibration, and displacement on at least the second main surface of the first main surface and the second main surface may become maximal or minimal at an intermediate region in the direction, in which the first electrode finger and the second electrode finger are arranged, of the portion overlapping with the gap.

Accordingly, vibration characteristics are not easily affected by electrodes, and favorable frequency temperature characteristics can be thereby obtained. Especially, the second-order coefficient and the third-order coefficient of temperature coefficients of frequency can be decreased.

A crystal resonator according to an exemplary aspect includes a crystal substrate that has a first main surface and a second main surface that is opposed to the first main surface; a first comb electrode that is provided on the first main surface of the crystal substrate; and a second comb electrode that is provided on the first main surface of the crystal substrate. Each of the first and second comb electrodes include a plurality of electrode fingers that are alternately arranged in a manner to be separated from each other. The plurality of electrode fingers of the first comb electrode include a first electrode finger. The plurality of electrode fingers of the second comb electrode include a second electrode finger that is adjacent to the first electrode finger. Thickness shear vibration is excited at a portion overlapping with a gap between the first electrode finger and the second electrode finger, depending on a potential difference between the first electrode finger and the second electrode finger. The first and second main surfaces are configured to displace in a direction parallel to the first electrode finger and the second electrode finger along with the thickness shear vibration. Displacement on at least the second main surface of the first main surface and the second main surface becomes maximal or minimal at an intermediate region in a direction, in which the first electrode finger and the second electrode finger are arranged, of the portion overlapping with the gap.

Accordingly, vibration characteristics are not easily affected by electrodes, and favorable frequency temperature characteristics can be thereby obtained. Especially, the second-order coefficient and the third-order coefficient of temperature coefficients of frequency can be decreased.

In an exemplary aspect, displacement on the first main surface may become maximal or minimal at the intermediate region in the direction, in which the first electrode finger and the second electrode finger are arranged, of the portion overlapping with the gap.

Accordingly, more favorable frequency temperature characteristics can be obtained.

In an exemplary aspect, when a width of the first electrode finger is denoted as L1 and a width of the second electrode finger is denoted as L2 and a distance between the first electrode finger and the second electrode finger is denoted as P1 in the direction in which the first electrode finger and the second electrode finger are arranged, a duty ratio (L1+L2)/(2×P1) on a first main surface side may be from 0.15 to 0.3 inclusive.

Accordingly, favorable quality factor and acoustic velocity can be obtained.

In an exemplary aspect, the duty ratio (L1+L2)/(2×P1) on the first main surface side may be in a range of 0.25±10%.

Accordingly, favorable electromechanical coupling coefficient, quality factor, and acoustic velocity can be more securely obtained.

In an exemplary aspect, when an X axis of a crystal axis is set as a rotation axis and a counterclockwise rotation angle viewed from a positive direction side of the X axis of the crystal axis is set as positive, the crystal substrate may be a crystal plate with a cut-angle obtained by rotating a Y-cut crystal plate by a rotation angle of 35°±10°.

In an exemplary aspect, when an X axis of a crystal axis is set as a rotation axis and a counterclockwise rotation angle viewed from a positive direction side of the X axis of the crystal axis is set as positive, the crystal substrate may be a crystal plate with a cut-angle obtained by rotating a Y-cut crystal plate by a rotation angle of −59°±10°.

In an exemplary aspect, the crystal resonator may further include a third comb electrode that is provided on the second main surface of the crystal substrate, and a fourth comb electrode that is provided on the second main surface of the crystal substrate, in which each of the third comb electrode and the fourth comb electrode may include a plurality of electrode fingers, where the plurality of electrode fingers of the third comb electrode and the plurality of electrode fingers of the fourth comb electrode are alternately arranged in a manner to be separated from each other in the direction in which the first electrode finger and the second electrode finger are arranged; the plurality of electrode fingers of the third comb electrode may include a third electrode finger; the plurality of electrode fingers of the fourth comb electrode may include a fourth electrode finger that is adjacent to the third electrode finger; in a plan view of the second main surface, the third electrode finger may be provided between two electrode fingers that are adjacent to the first electrode finger on the first main surface; in a plan view of the second main surface, the fourth electrode finger may be provided between two electrode fingers that are adjacent to the second electrode finger on the first main surface; a potential difference between the third electrode finger and the first electrode finger may be smaller than a potential difference between the third electrode finger and the second electrode finger; and a potential difference between the fourth electrode finger and the second electrode finger may be smaller than a potential difference between the fourth electrode finger and the first electrode finger.

Accordingly, electrostatic capacity can be further increased.

In an exemplary aspect, in a plan view of the second main surface, a distance between a central axis of the third electrode finger and a central axis of the first electrode finger may be larger than 0 and may be smaller than a distance between the central axis of the third electrode finger and a central axis of the second electrode finger, in a direction in which the third electrode finger and the fourth electrode finger are arranged.

In an exemplary aspect, the crystal substrate may be a rotated Y-cut crystal plate obtained by rotating a Y-cut crystal plate about an X axis of a crystal axis used as a rotation axis; and when the second main surface is positioned on a negative direction side of a Y axis of the crystal axis with respect to the first main surface, the central axis of the third electrode finger may be positioned on a positive direction side of the Y axis of the crystal axis projected onto the second main surface with respect to the central axis of the first electrode finger.

This configuration reduces an influence of electrodes on vibration characteristics. As a result, a favorable electromechanical coupling coefficient is obtained.

In an exemplary aspect, the first electrode finger, the second electrode finger, the third electrode finger, and the fourth electrode finger may be provided in a region of the crystal substrate in which distortion is 10% or lower of maximum distortion.

This configuration reduces an influence of electrodes on vibration characteristics. As a result, a favorable electromechanical coupling coefficient is obtained.

In an exemplary aspect, when a width of the first electrode finger is denoted as L1 and a width of the second electrode finger is denoted as L2 and a distance between the first electrode finger and the second electrode finger is denoted as P1 in the direction in which the first electrode finger and the second electrode finger are arranged, and a width of the third electrode finger is denoted as L3 and a width of the fourth electrode finger is denoted as L4 and a distance between the third electrode finger and the fourth electrode finger is denoted as P2 in a direction in which the third electrode finger and the fourth electrode finger are arranged, a duty ratio $(L3+L4)/(2\times P2)$ on a second main surface side may be within a range of $\pm 10\%$ of a duty ratio $(L1+L2)/(2\times P1)$ on a first main surface side.

In an exemplary aspect, when thickness of the crystal substrate is denoted as $Tq$, thickness of the first electrode finger is denoted as $Te1$, and thickness of the second electrode finger is denoted as $Te2$, a film thickness ratio $Te1/Tq$ of the first electrode finger may be 0.05 or higher, and a film thickness ratio $Te2/Tq$ of the second electrode finger may be 0.05 or higher.

In an exemplary aspect, a thickness ratio $Te1/Tq$ of the first electrode finger may be 0.2 or higher, and a thickness ratio $Te2/Tq$ of the second electrode finger may be 0.2 or higher.

In an exemplary aspect, a thickness ratio $Te1/Tq$ of the first electrode finger may be 0.5 or lower, and a thickness ratio $Te2/Tq$ of the second electrode finger may be 0.5 or lower.

In an exemplary aspect, the first comb electrode and the second comb electrode comprise at least 90% or more of aluminum.

According to one exemplary aspect, a crystal resonator is provided that achieves improvement in characteristics as described above.

It should be noted that the exemplary embodiments described above are provided for facilitating the understanding of the present invention, and are not provided for limiting the interpretation of the present invention. The present invention can be modified/improved without departing from the spirit thereof, and the present invention also includes an equivalent thereof. That is, embodiments and/or modifications whose designs are appropriately changed by those skilled in the art are also included in the scope of the present invention as long as the embodiments and/or the modifications have the features of the present invention. For example, elements included in the embodiments and/or the modifications and those arrangements, materials, conditions, shapes, sizes, and the like are not limited to those exemplified, and can be appropriately changed. Further, the embodiments and modifications are exemplary and it goes without saying that partial substitution or combination of the configurations described in different embodiments and/or modifications can be performed, and this is also included in the scope of the present invention as long as the features of the present invention are included.

REFERENCE SIGNS LIST 1 crystal resonator
10 crystal substrate
10A first main surface
10B second main surface
IDT1 first comb electrode
IDT2 second comb electrode
11A, 12A electrode finger
11B, 12B busbar
11 first electrode finger
12 second electrode finger
11C first extended electrode
12C second extended electrode
11D first connection electrode
12D second connection electrode
17 central portion
18 peripheral portion
18A to 18D frame body 19A to 19D through hole
L1 width of first electrode finger
L2 width of second electrode finger
P1 distance between first electrode finger and the second electrode finger (pitch)

The invention claimed is:

1. A resonator comprising:
a crystal substrate that has a first main surface and a second main surface that opposes the first main surface;
first and second comb electrodes on the first main surface of the crystal substrate, each of the first and second comb electrodes including a plurality of electrode fingers that are alternately arranged and separated from each other,
wherein the plurality of electrode fingers of the first comb electrode includes a first electrode finger and the plurality of electrode fingers of the second comb electrode includes a second electrode finger that is adjacent to the first electrode finger,
wherein a thickness shear vibration is excited at a portion that overlaps with a gap between the first and second electrode fingers, which depends on a potential difference between the first and second electrode fingers, and
wherein a duty ratio (L1+L2)/(2×P1) on a side of the first main surface is from 0.15 to 0.33 inclusive or from 0.62 to 0.82 inclusive, where L1 a width of the first electrode finger, L2 is a width of the second electrode finger, and P1 is a distance between the first and second electrode fingers in a direction in which the first and second electrode fingers extend.

2. The resonator according to claim 1, wherein the width L1 of the first electrode finger is equal to the width L2 of the second electrode finger.

3. The resonator according to claim 1, wherein:
the first and second main surfaces are configured to displace in a direction parallel to the first and second electrode fingers along with the thickness shear vibration, and
a displacement on at least the second main surface becomes maximal or minimal at an intermediate region in the direction, in which the first and second electrode fingers extend, of the portion overlapping with the gap.

4. The resonator according to claim 1, wherein the duty ratio (L1+L2)/(2×P1) on the side of the first main surface is from 0.15 to 0.3 inclusive.

5. The resonator according to claim 4, wherein the duty ratio (L1+L2)/(2×P1) on the side of the first main surface is in a range of 0.25±10%.

6. The resonator according to claim 1, wherein, when an X axis of a crystal axis is set as a rotation axis and a counterclockwise rotation angle viewed from a positive direction side of the X axis of the crystal axis is set as positive, the crystal substrate is a crystal plate with a cut-angle obtained by rotating a Y-cut crystal plate by a rotation angle of 35°±10°.

7. The resonator according to claim 1, wherein, when an X axis of a crystal axis is set as a rotation axis and a counterclockwise rotation angle viewed from a positive direction side of the X axis of the crystal axis is set as positive, the crystal substrate is a crystal plate with a cut-angle obtained by rotating a Y-cut crystal plate by a rotation angle of −59°±10°.

8. The resonator according to claim 1, further comprising:
a third comb electrode on the second main surface of the crystal substrate; and
a fourth comb electrode on the second main surface of the crystal substrate, wherein each of the third and fourth comb electrodes includes a plurality of electrode fingers that are alternately arranged and separated from each other in the direction in which the first and second electrode fingers extend,
wherein the plurality of electrode fingers of the third comb electrode include a third electrode finger,
wherein the plurality of electrode fingers of the fourth comb electrode include a fourth electrode finger that is adjacent to the third electrode finger,
wherein, in a plan view of the second main surface, the third electrode finger is disposed between two electrode fingers that are adjacent to the first electrode finger on the first main surface,
wherein, in the plan view of the second main surface, the fourth electrode finger is disposed between two electrode fingers that are adjacent to the second electrode finger on the first main surface,
wherein a potential difference between the third electrode finger and the first electrode finger is smaller than a potential difference between the third electrode finger and the second electrode finger, and
wherein a potential difference between the fourth electrode finger and the second electrode finger is smaller than a potential difference between the fourth electrode finger and the first electrode finger.

9. The resonator according to claim 8, wherein, in the plan view of the second main surface, a distance between a central axis of the third electrode finger and a central axis of the first electrode finger is larger than 0 and is smaller than a distance between the central axis of the third electrode finger and a central axis of the second electrode finger, in a direction in which the third and fourth electrode fingers extend.

10. The resonator according to claim 9, wherein:
the crystal substrate is a rotated Y-cut crystal plate obtained by rotating a Y-cut crystal plate about an X axis of a crystal axis used as a rotation axis, and
when the second main surface is positioned on a negative direction side of a Y axis of the crystal axis with respect to the first main surface, the central axis of the third electrode finger is positioned on a positive direction side of the Y axis of the crystal axis projected onto the second main surface with respect to the central axis of the first electrode finger.

11. The resonator according to claim 9, wherein the first electrode finger, the second electrode finger, the third electrode finger, and the fourth electrode finger are disposed in a region of the crystal substrate in which distortion is 10% or lower of maximum distortion.

12. The resonator according to claim 8, wherein:
L3 is a width of the third electrode finger, L4 is a width of the fourth electrode finger, and P2 is a distance between the third and fourth electrode fingers in a direction in which the third and fourth electrode fingers extend, and
a duty ratio (L3+L4)/(2×P2) on a second main surface side is within a range of ±10% of a duty ratio (L1+L2)/(2×P1) on a first main surface side.

13. The resonator according to claim 1, wherein:
Tq is a thickness of the crystal substrate, Te1 is a thickness of the first electrode, and Te2 is a thickness of the second electrode finger,
Te1/Tq of the first electrode finger is at least 0.05, and
Te2/Tq of the second electrode finger is at least 0.05.

14. The resonator according to claim 13, wherein:
Te1/Tq of the first electrode finger is at least 0.2, and Te2/Tq of the second electrode finger is at least 0.2.

15. The resonator according to claim 13, wherein:

Te1/Tq of the first electrode finger is equal to or less than 0.5, and

Te2/Tq of the second electrode finger is equal to or less than 0.5.

16. The resonator according to claim 1, wherein each of the first comb electrode and the second comb electrode comprise at least 90% aluminum.

17. A resonator comprising:

a crystal substrate that has first and second main surfaces that oppose each other; and first and second comb electrodes on the first main surface of the crystal substrate that each includes a plurality of electrode fingers that are alternately arranged to be separated from each other, wherein the plurality of electrode fingers of the first comb electrode include a first electrode finger, and the plurality of electrode fingers of the second comb electrode include a second electrode finger that is adjacent to the first electrode finger, wherein a thickness shear vibration is excited at a portion that overlaps a gap between the first and second electrode fingers, wherein the first and second main surfaces are configured to displace in a direction parallel to the first and second electrode fingers in response to the thickness shear vibration, and wherein a displacement on at least the second main surface becomes maximal or minimal at an intermediate region in a direction, in which the first and second electrode fingers extend, of the portion overlapping with the gap.

18. The resonator according to claim 17, wherein the thickness shear vibration is excited based on a potential difference between the first and second electrode fingers.

19. The resonator according to claim 17, wherein a displacement on the first main surface becomes maximal or minimal at the intermediate region in the direction, in which the first and second electrode fingers extend, of the portion overlapping with the gap.

20. The resonator according to claim 17, wherein a duty ratio (L1+L2)/(2×P1) on a first main surface side is from 0.15 to 0.33 inclusive or from 0.62 to 0.82 inclusive, where L1 a width of the first electrode finger, L2 is a width of the second electrode finger, and P1 is a distance between the first and second electrode fingers in a direction in which the first and second electrode fingers extend.

* * * * *